(12) United States Patent
Mengel et al.

(10) Patent No.: US 10,930,614 B2
(45) Date of Patent: Feb. 23, 2021

(54) CHIP ARRANGEMENTS

(71) Applicant: Infineon Technologies AG, Neubiberg (DE)

(72) Inventors: Manfred Mengel, Bad Abbach (DE); Alexander Heinrich, Regensburg (DE); Steffen Orso, Reutlingen (DE); Thomas Behrens, Wenzenbach (DE); Oliver Eichinger, Regensburg (DE); Lim Fong, Melaka (MY); Evelyn Napetschnig, Diex (AT); Edmund Riedl, Wald (DE)

(73) Assignee: Infineon Technologies AG, Neubiberg (DE)

( * ) Notice: Subject to any disclaimer, the term of this patent is extended or adjusted under 35 U.S.C. 154(b) by 96 days.

(21) Appl. No.: 15/659,670

(22) Filed: Jul. 26, 2017

(65) Prior Publication Data

US 2017/0323865 A1 Nov. 9, 2017

Related U.S. Application Data

(63) Continuation of application No. 13/154,523, filed on Jun. 7, 2011, now Pat. No. 9,735,126.

(51) Int. Cl.
*H01L 23/00* (2006.01)
*B23K 35/30* (2006.01)
(Continued)

(52) U.S. Cl.
CPC ............ *H01L 24/48* (2013.01); *B23K 1/0016* (2013.01); *B23K 35/262* (2013.01);
(Continued)

(58) Field of Classification Search
CPC ....... H01L 2224/29118; H01L 2924/00; H01L 2224/48247; H01L 2224/32245;
(Continued)

(56) References Cited

U.S. PATENT DOCUMENTS 4,758,479 A * 7/1988 Swathirajan ........... C25D 3/562
205/143
5,268,072 A * 12/1993 Agarwala ............... H01L 24/03
216/13

(Continued)

FOREIGN PATENT DOCUMENTS

| WO | WO 0209936 A1 * | 2/2002 | ............ B32B 15/20 |
| WO | WO-0209936 A1 * | 2/2002 | ............ H01L 24/29 |
| WO | WO 2007045191 A2 * | 4/2007 | ............ C22C 13/00 |

*Primary Examiner* — Edward Chin
(74) *Attorney, Agent, or Firm* — Viering, Jentschura & Partner MBB

(57) ABSTRACT

A chip arrangement including a chip comprising a chip back side; a back side metallization on the chip back side, the back side metallization including a plurality of layers; a substrate comprising a surface with a metal layer; a zinc-based solder alloy configured to attach the back side metallization to the metal layer, the zinc-based solder alloy having by weight 8% to 20% aluminum, 0.5% to 20% magnesium, 0.5% to 20% gallium, and the balance zinc; wherein the metal layer is configured to provide a good wettability of the zinc-based solder alloy on the surface of the substrate. The plurality of layers may include one or more of a contact layer configured to contact a semiconductor material of the chip back side; a barrier layer; a solder reaction, and an oxidation protection layer configured to prevent oxidation of the solder reaction layer.

16 Claims, 17 Drawing Sheets

(51) Int. Cl.
*B23K 35/26* (2006.01)
*B23K 35/28* (2006.01)
*C22C 13/00* (2006.01)
*C22C 18/00* (2006.01)
*C22C 18/04* (2006.01)
*C22C 30/04* (2006.01)
*C22C 30/06* (2006.01)
*H01L 23/488* (2006.01)
*H01L 23/495* (2006.01)
*B23K 1/00* (2006.01)

(52) U.S. Cl.
CPC ........ B23K 35/282 (2013.01); B23K 35/3013 (2013.01); C22C 13/00 (2013.01); C22C 18/00 (2013.01); C22C 18/04 (2013.01); C22C 30/04 (2013.01); C22C 30/06 (2013.01); H01L 23/488 (2013.01); H01L 23/49513 (2013.01); H01L 24/29 (2013.01); H01L 24/32 (2013.01); H01L 24/83 (2013.01); H01L 24/73 (2013.01); *H01L 2224/05599* (2013.01); *H01L 2224/29111* (2013.01); *H01L 2224/29118* (2013.01); *H01L 2224/29139* (2013.01); *H01L 2224/32245* (2013.01); *H01L 2224/45014* (2013.01); *H01L 2224/45015* (2013.01); *H01L 2224/45099* (2013.01); *H01L 2224/45139* (2013.01); *H01L 2224/45144* (2013.01); *H01L 2224/45147* (2013.01); *H01L 2224/45155* (2013.01); *H01L 2224/45164* (2013.01); *H01L 2224/45169* (2013.01); *H01L 2224/48091* (2013.01); *H01L 2224/48247* (2013.01); *H01L 2224/48465* (2013.01); *H01L 2224/73265* (2013.01); *H01L 2224/83* (2013.01); *H01L 2224/85455* (2013.01); *H01L 2224/92247* (2013.01); *H01L 2924/00* (2013.01); *H01L 2924/00011* (2013.01); *H01L 2924/00012* (2013.01); *H01L 2924/00014* (2013.01); *H01L 2924/0103* (2013.01); *H01L 2924/0105* (2013.01); *H01L 2924/01012* (2013.01); *H01L 2924/01013* (2013.01); *H01L 2924/01029* (2013.01); *H01L 2924/01032* (2013.01); *H01L 2924/01047* (2013.01); *H01L 2924/01049* (2013.01); *H01L 2924/01322* (2013.01); *H01L 2924/10253* (2013.01); *H01L 2924/15747* (2013.01); *H01L 2924/207* (2013.01)

(58) Field of Classification Search
CPC . H01L 2224/48091; H01L 2224/48465; H01L 2224/73265; H01L 2924/0103; H01L 2224/29111; H01L 2224/29139; H01L 2224/92247
USPC .......................................... 257/E23.031, 676
See application file for complete search history.

(56) References Cited

U.S. PATENT DOCUMENTS

| | | | | |
|---|---|---|---|---|
| 5,698,160 | A * | 12/1997 | Chen | B23K 35/262 420/557 |
| 5,986,338 | A * | 11/1999 | Nakajima | H01L 23/13 257/700 |
| 6,194,777 | B1 * | 2/2001 | Abbott | H01L 23/49582 257/666 |
| 6,241,942 | B1 * | 6/2001 | Murata | B23K 35/262 420/561 |
| 7,833,839 | B1 * | 11/2010 | Touzelbaev | H01L 24/28 438/122 |
| 8,354,754 | B2 * | 1/2013 | Berberich | H01L 24/05 257/779 |
| 2005/0020032 | A1 * | 1/2005 | Solanki | H01L 21/76251 438/458 |
| 2005/0167679 | A1 * | 8/2005 | Ishii | H01S 5/02236 257/79 |
| 2006/0145352 | A1 * | 7/2006 | Soga | H01L 24/11 257/772 |
| 2008/0122050 | A1 * | 5/2008 | Ikeda | H01L 24/27 257/669 |
| 2008/0206588 | A1 * | 8/2008 | Lange | H01L 24/11 428/620 |
| 2008/0233683 | A1 * | 9/2008 | Kwan | H01L 23/49582 438/123 |
| 2009/0053555 | A1 * | 2/2009 | Nose | B32B 15/013 428/653 |
| 2010/0157568 | A1 * | 6/2010 | Ewe | H01L 23/49827 361/820 |
| 2012/0313230 | A1 * | 12/2012 | Mengel | B23K 35/3013 257/676 |

* cited by examiner

| P. Nash and Y.Y. Pan, 1991 | | | |
|---|---|---|---|
| Phase | Composition wt % Zn | Pearason symbol | Space group |
| (Ni) | 0 to 41.9 | cF4 | Fm$\bar{3}$nr |
| β | 50 to 60.9 | cP2 | Pm$\bar{3}$nr |
| β' | 48.0 to 54.5 | tP2 | P4/mmrn |
| γ(a) | 72 to 86 | cI52 | I$\bar{4}$3m |
| δ | ~90 | mC6 | C2/m |
| (Zn) | 100 | hP2 | P6$_3$/mmc |
| (a) Might have orthohombic structure | | | |

FIG 8
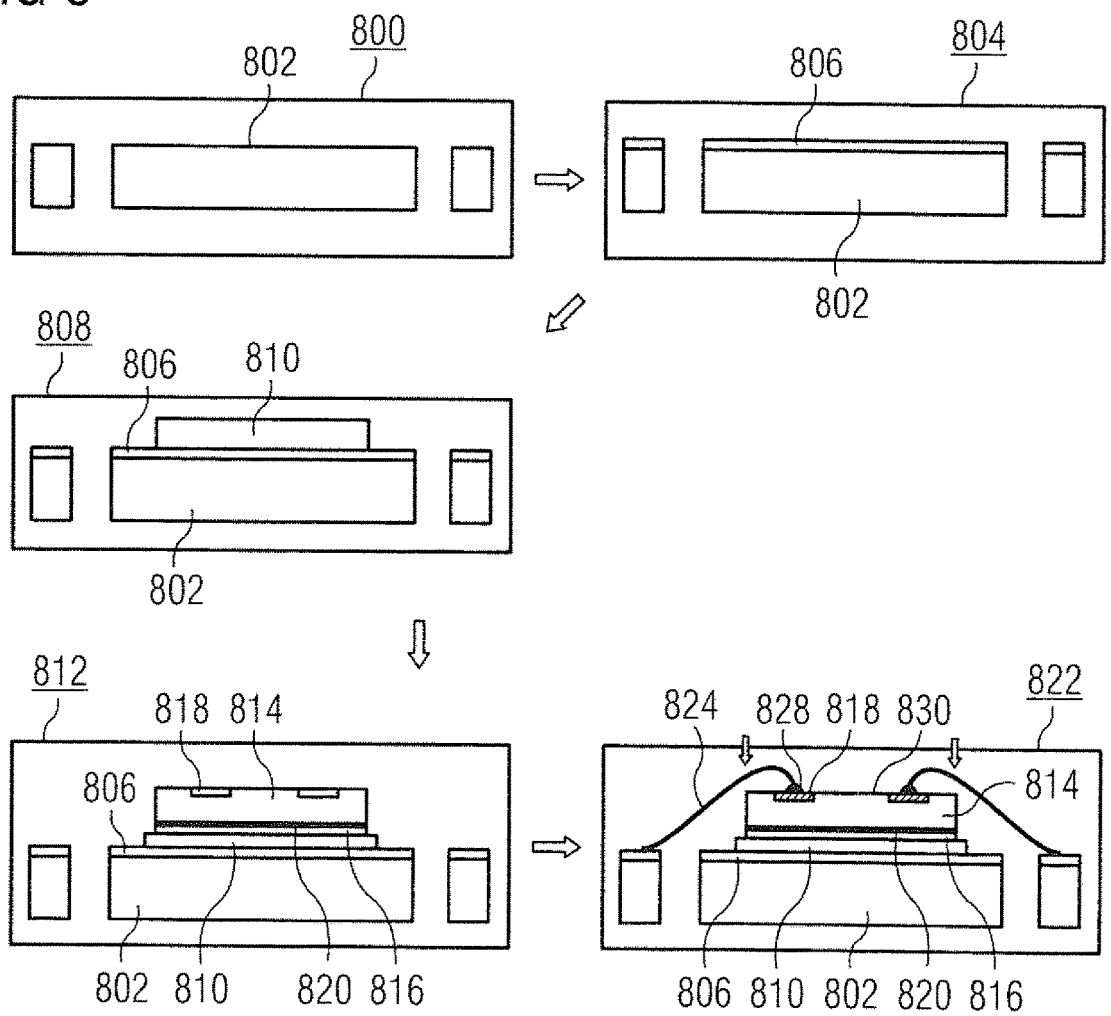
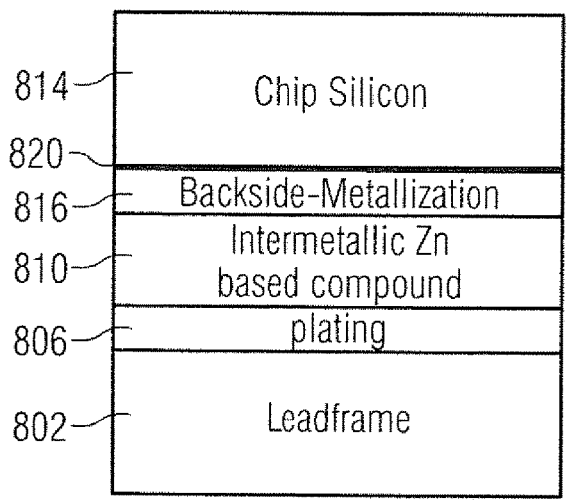
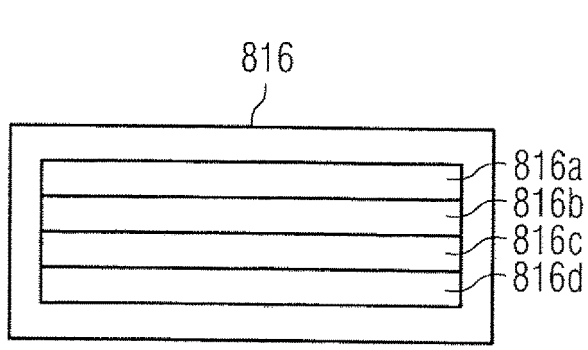

FIG 9A
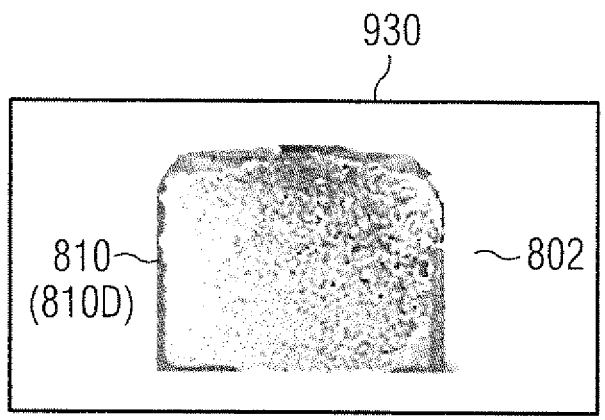
930, 810 (810D), 802
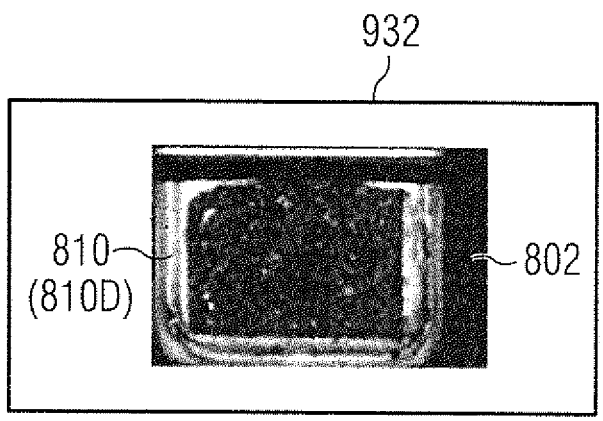
932, 810 (810D), 802
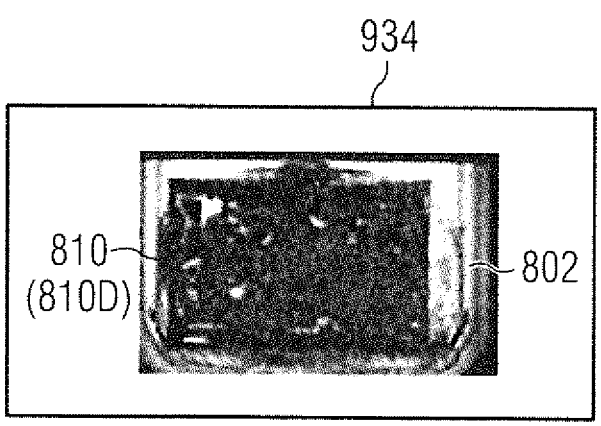
934, 810 (810D), 802

FIG 9B
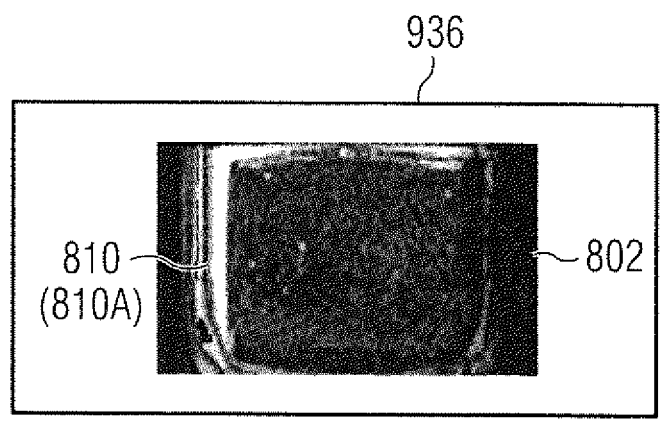
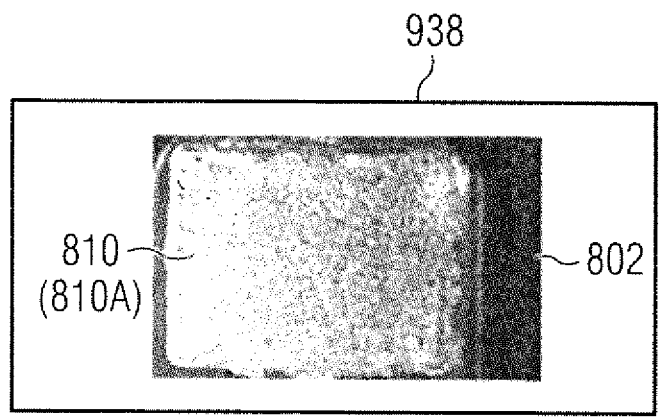
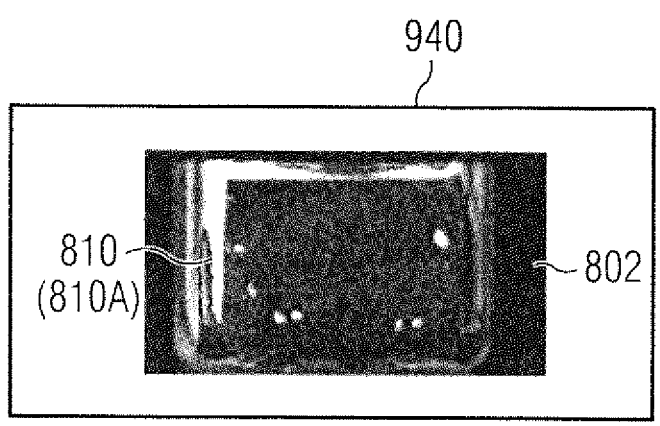

FIG 12
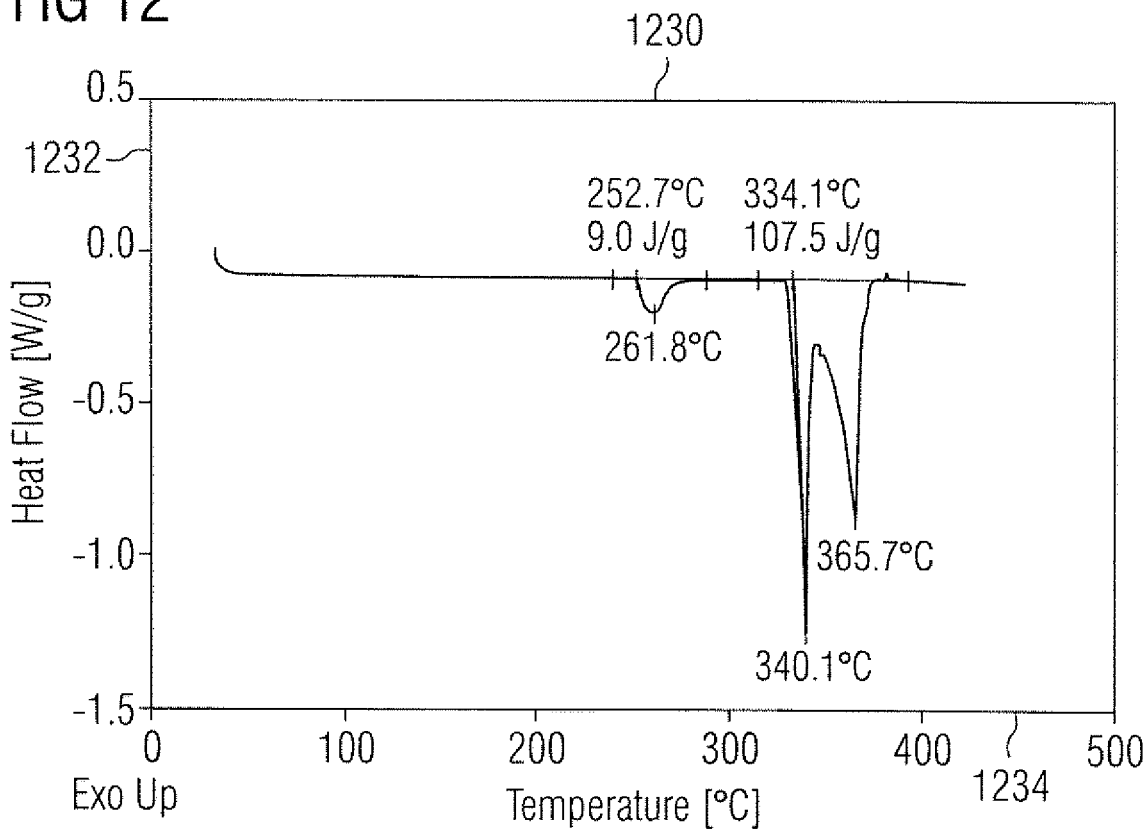
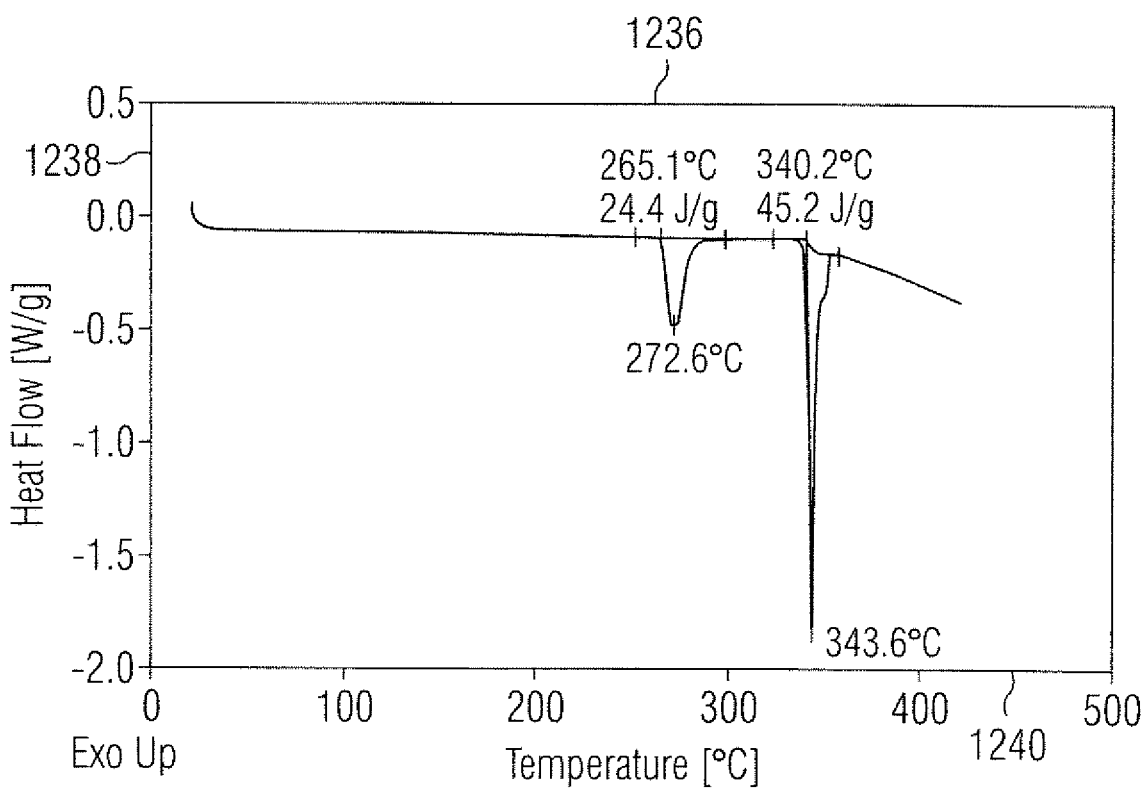

FIG 14
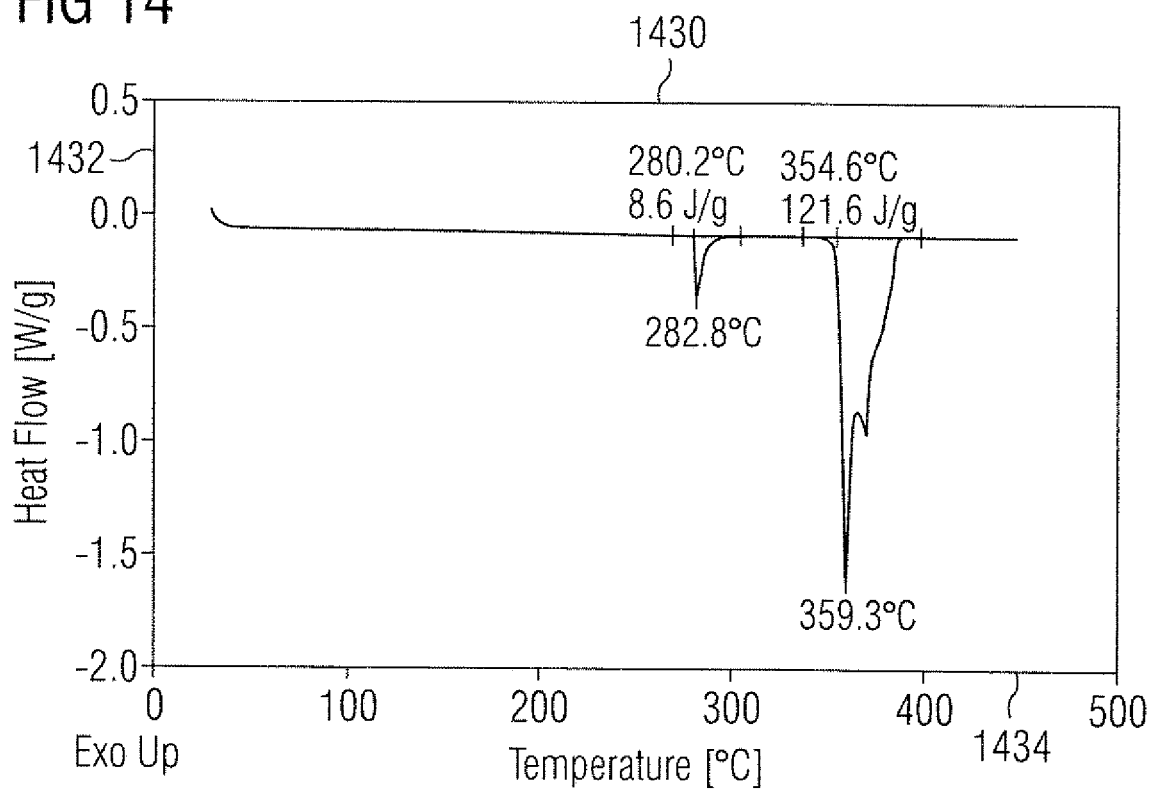
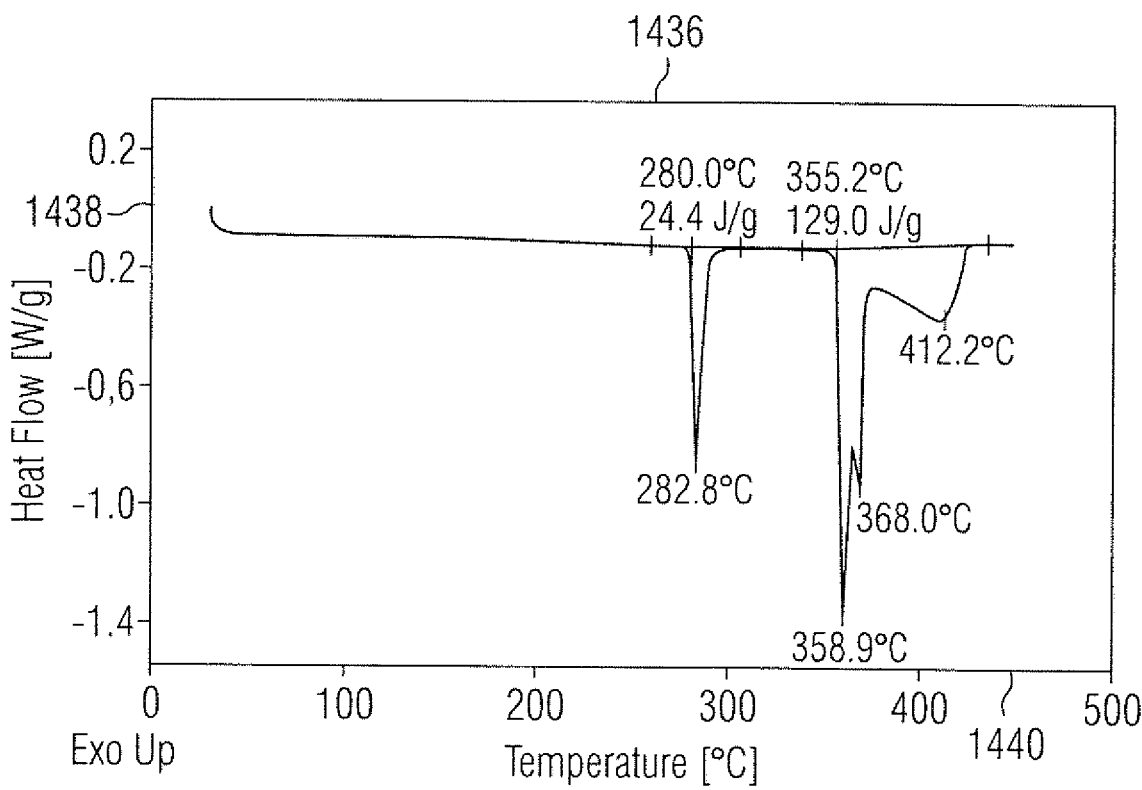

FIG 16
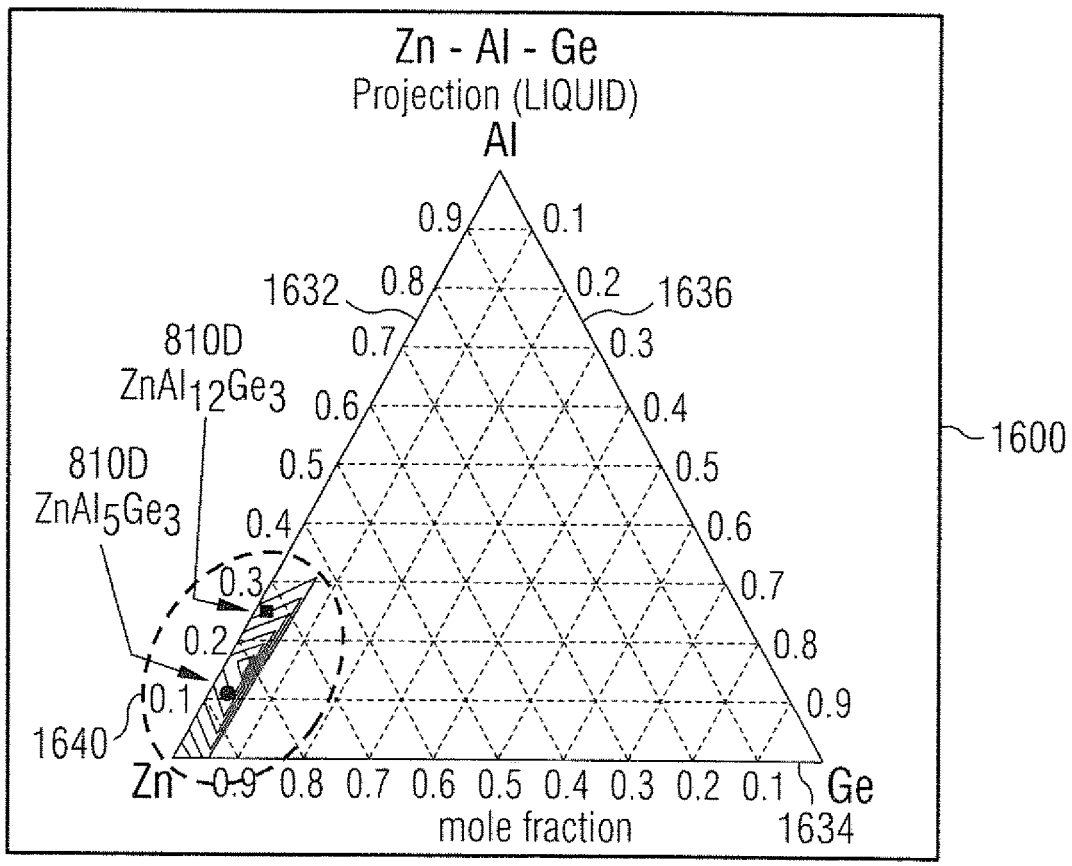
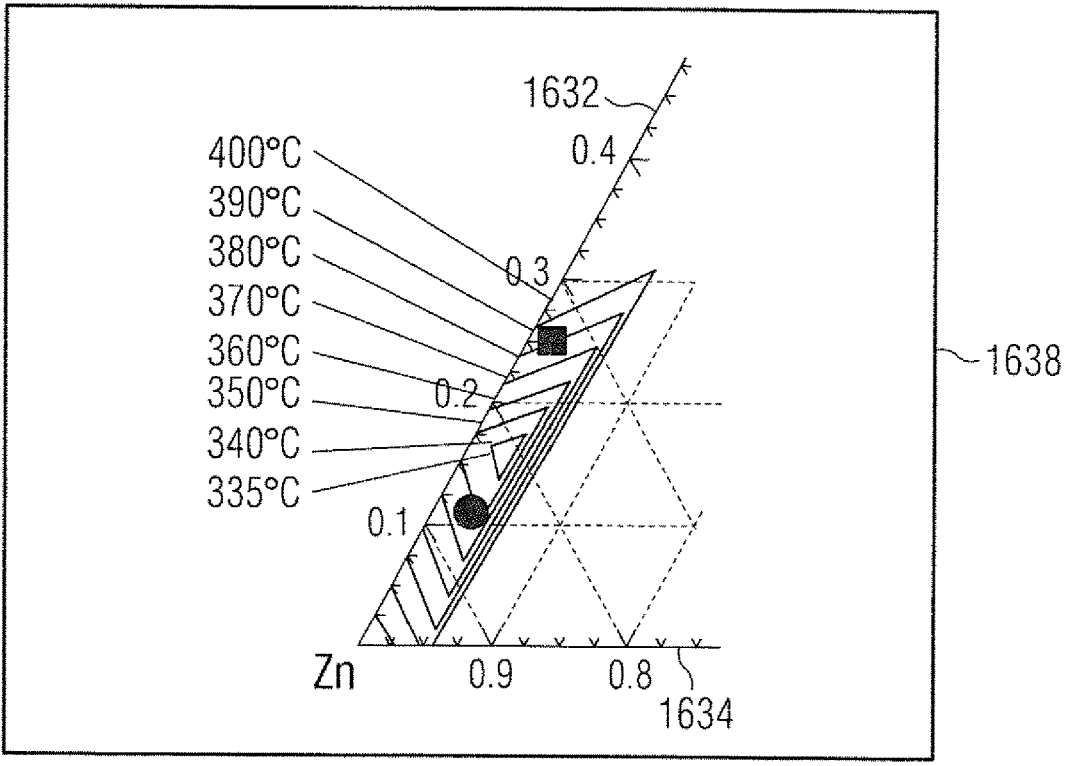

CHIP ARRANGEMENTS

CROSS-REFERENCED APPLICATIONS

This is a continuation of U.S. Ser. No. 13/154,523, filed on Jun. 7, 2011, which is hereby incorporated by reference in its entirety.

TECHNICAL FIELD

Various embodiments relate generally to chip arrangements.

BACKGROUND

Decisions have been made by the European Union to ban environmentally hazardous substances in the near future; such decisions having been made with regard to end-of-life vehicles ELV, indicating that hazardous substances such as lead should be banned. Lead-based products, e.g. lead-based solder materials used for die or semiconductor chip attachment, will be banned and removed from the market in the near future.

Suitable alternative solder materials will in future be selected based on their economic viability. The cost of suitable alternatives would have to be at least comparable to that of current standard solder materials. Suitable alternatives will further have to meet the requirements and have the necessary properties to be used as a connection element, e.g. a solder connection. Such alternatives would have to be compatible for use on various surfaces, e.g. on lead frames or on chip back sides. They would also have to be electrically and thermally conductive, and robust and reliable enough for their application, e.g. being subjected to high temperatures or varying temperature loads.

A further technical requirement is that the solidus temperature of the solder material should lie above 260° C., so that the solder material will not melt and/or soften when subsequent processes are carried out, e.g. when soldering the printer circuit board. Further requirements of alternative solder materials are that they meet the requirements of ductility such that solder wires may be provided from the solder materials.

Up till now, the semiconductor field has not had a lead-free soft solder alternative for the connection of a chip to a lead frame, or from a clip to a bond pad, which may be achieved in mass production. The technical challenge lies in finding a lead-free solder which has a melting temperature over that of the solder material used in printed circuit boards e.g. Sn—Ag—Cu systems, with typical melting temperatures of 260° C. However, the melting temperature should not be too high either, as high mechanical stress would have to be installed in the system to cool down and at the same time, solidify the solder.

A lead-free solder material, apart from the melting temperature requirements, should have good wettability with various metallic surfaces e.g. chip surfaces or lead frames which may be used, to ensure that an optimal connection is provided. The solder material should further possess a certain ductility so that it can be produced and handled in wire form. That is, the solder material in wire form should not be brittle. The solder material has to withstand repetitive melting and solidification conditions, and mechanical and thermomechanical loads which may be applied to the material, without succumbing to degradation.

SUMMARY

A chip arrangement including a chip comprising a chip back side; a back side metallization on the chip back side, the back side metallization including a plurality of layers; a substrate comprising a surface with a metal layer; a zinc-based solder alloy configured to attach the back side metallization to the metal layer, the zinc-based solder alloy having by weight 8% to 20% aluminum, 0.5% to 20% magnesium, 0.5% to 20% gallium, and the balance zinc; wherein the metal layer is configured to provide a good wettability of the zinc-based solder alloy on the surface of the substrate.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 8 shows a method for attaching a chip to a carrier according to various embodiments;

FIGS. 9A and 9B show an arrangement for attaching a chip to a carrier according to various embodiments;

FIGS. 12 to 14 show differential scanning calorimetry plots of a solder alloy according to various embodiments.

FIG. 16 shows a plot of experimental solder composition versus theoretical liquid phase projection for a solder alloy comprising zinc, aluminum and germanium.

DETAILED DESCRIPTION

The following detailed description refers to the accompanying drawings that show, by way of illustration, specific details and embodiments in which the invention may be practiced. The word "exemplary" is used herein to mean "serving as an example, instance, or illustration". Any embodiment or design described herein as "exemplary" is not necessarily to be construed as preferred or advantageous over other embodiments or designs.

Various embodiments provide a lead-free (Pb-free) multilayer solder connection system for electronic components, including at least one side of a chip, a solder connection, e.g. a solder alloy, a carrier, e.g. a lead frame, and a plating, e.g. a lead frame plating, formed over the carrier.

Figure 1:
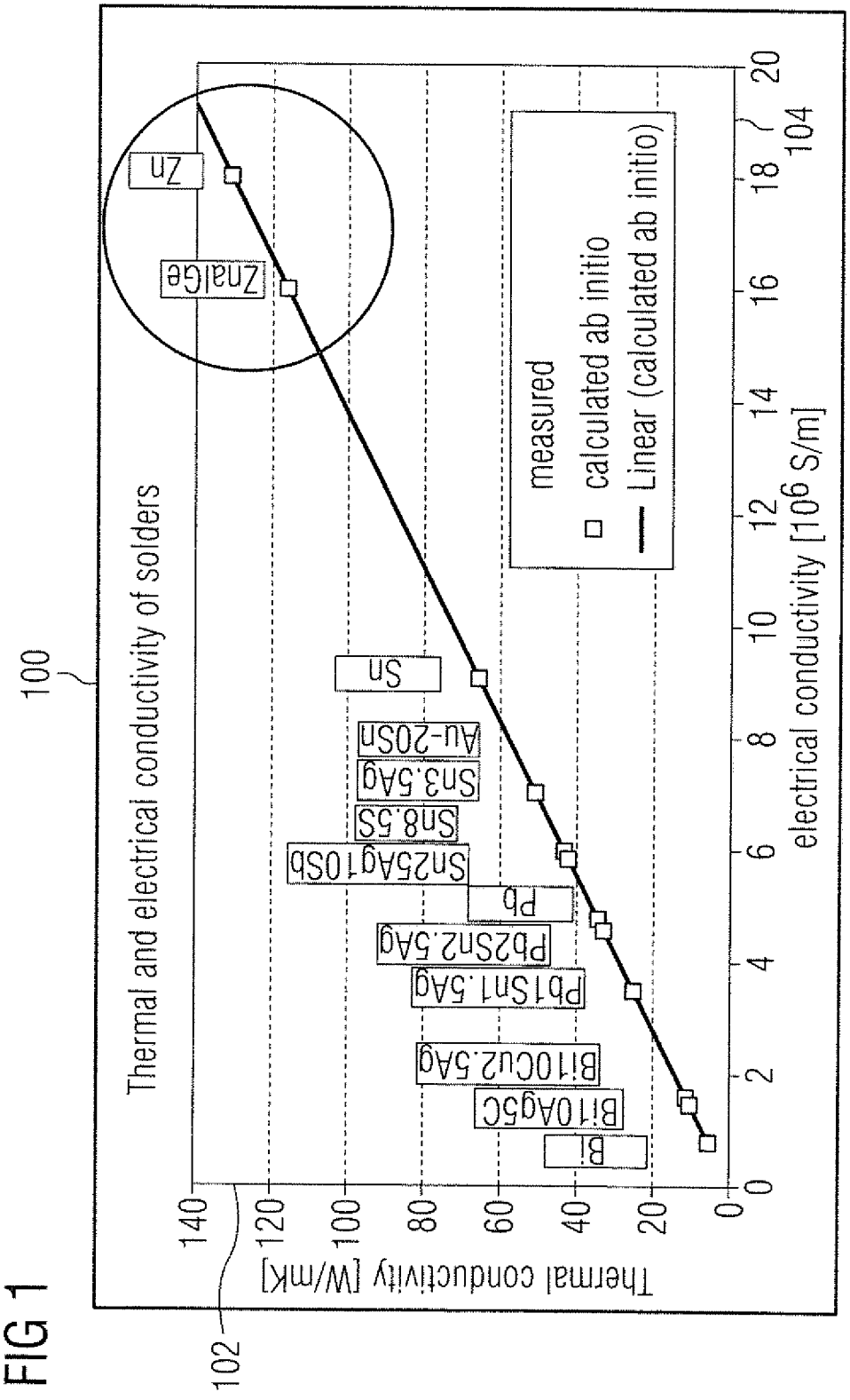
FIG. 1 shows a graph representing thermal conductivity (W/mK) vs. electrical conductivity ($10^6$ S/m) of solder alloys.

In comparison to lead-based solders, zinc-based solder systems have better physical characteristics, e.g. better thermal/heat and electrical conductivity. This can be seen from FIG. 1 wherein a plot 100 illustrating thermal conductivity (W/mK) versus electrical conductivity ($10^6$ S/m) is shown. Pure zinc, and a zinc alloy including aluminum and germanium are shown from measurements and from calculations to have higher thermal conductivity and electrical conductivity compared to lead-based and tin-based solders.

Figure 2:
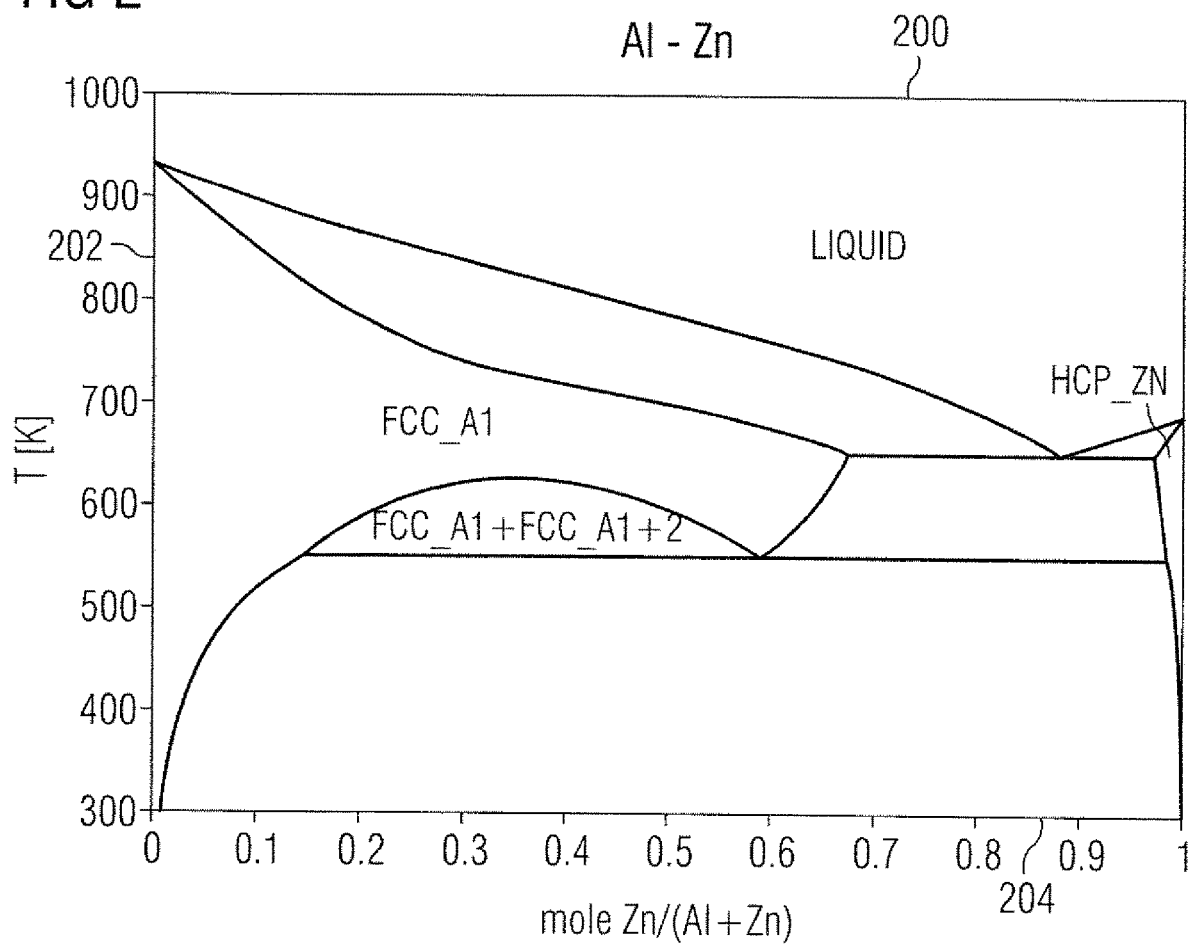
FIG. 2 shows a phase diagram 200 of an Al—Zn alloy.

FIG. 2 shows a phase diagram 200 of an Al—Zn binary alloy. With an atomic composition of 87.5% zinc and 12.5% aluminum, the Al—Zn binary alloy may achieve a melting point of approximately 650° C.

Figure 3:
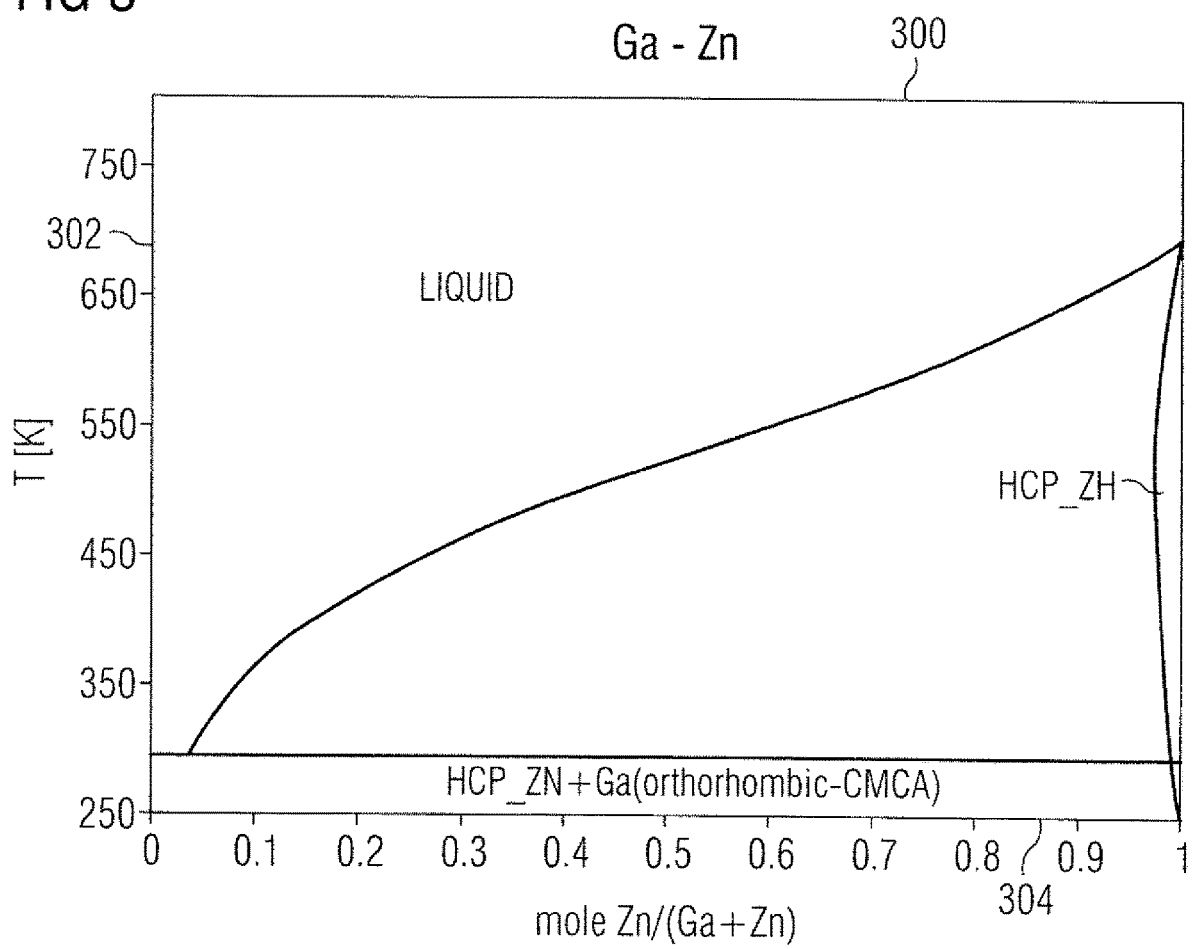
FIG. 3 shows a phase diagram 300 of a Ga—Zn alloy.

FIG. 3 shows a phase diagram 300 of a Ga—Zn binary alloy. With an atomic composition of 2.5% zinc and 87.5% gallium, the Ga—Zn binary alloy may achieve a melting point of approximately 300° C.

Figure 4:
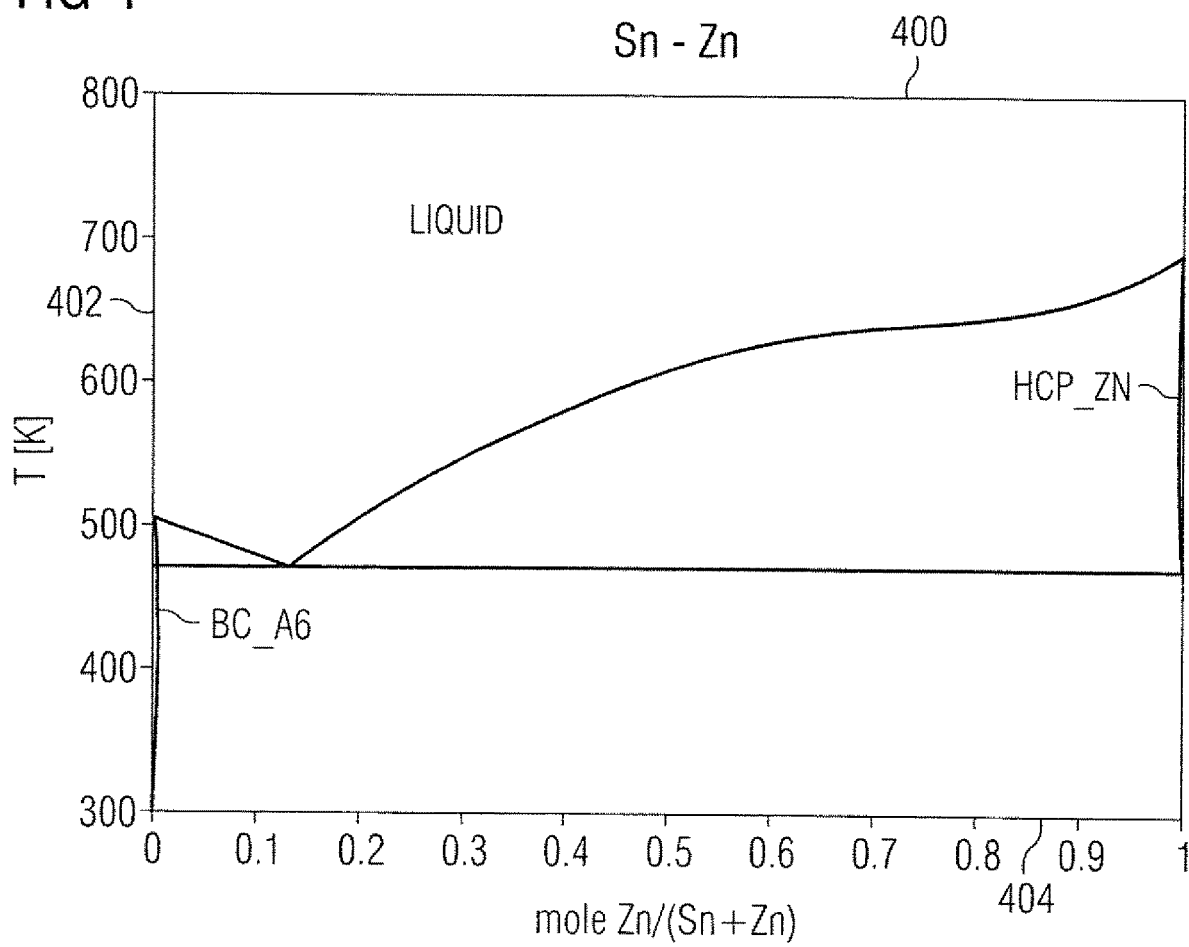
FIG. 4 shows a phase diagram 400 of a Sn—Zn alloy.

FIG. 4 shows a phase diagram 400 of a Sn—Zn binary alloy. At approximately 475° C., formed with an atomic composition of 13% zinc and 87% tin, the Sn—Zn binary alloy may achieve a melting point of approximately 475° C.

Figure 5:
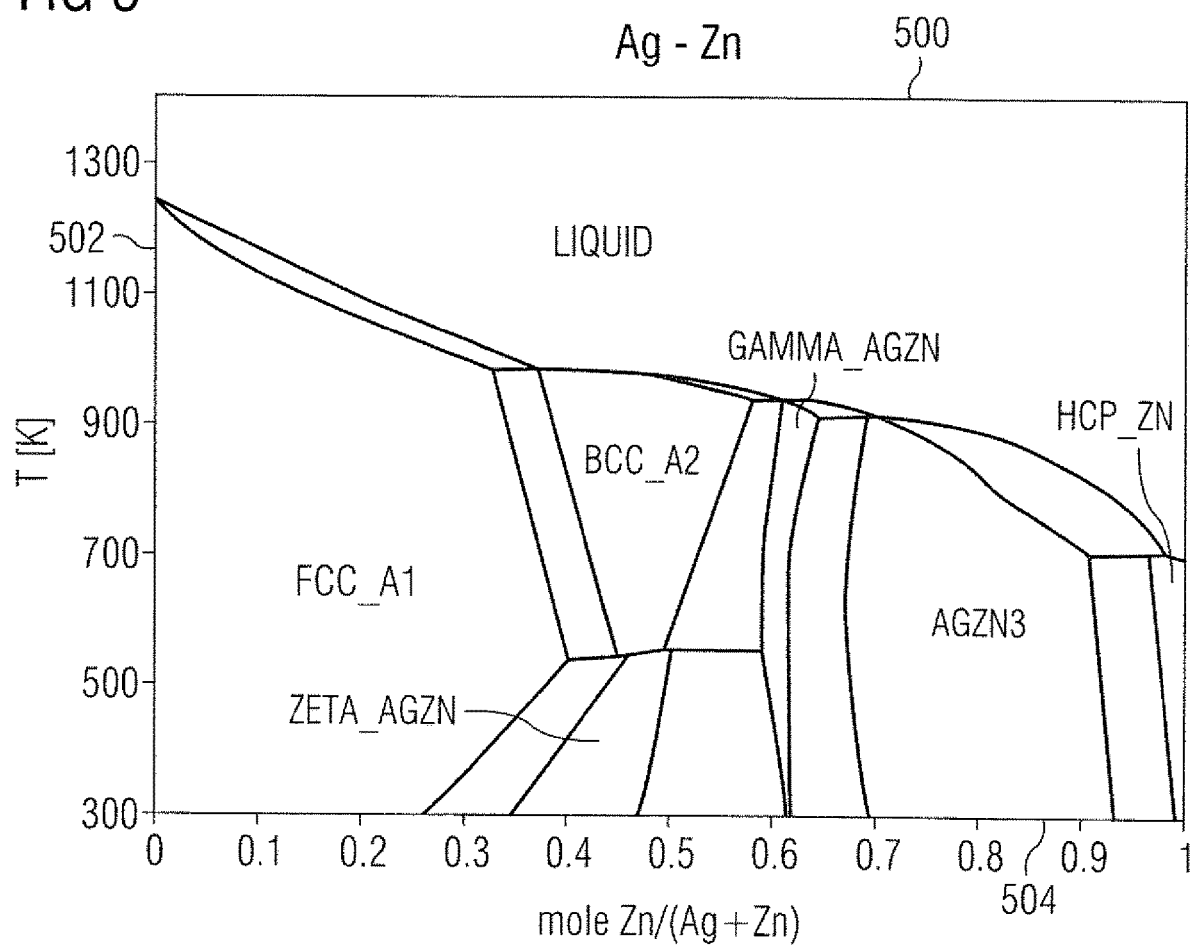
FIG. 5 shows a phase diagram 500 of a Ag—Zn alloy.

FIG. 5 shows a phase diagram 500 of a Ag—Zn binary alloy. With an atomic composition of 98% zinc and 2% silver, the Ag—Zn binary alloy may achieve a melting point of approximately 700° C.

Figure 6:
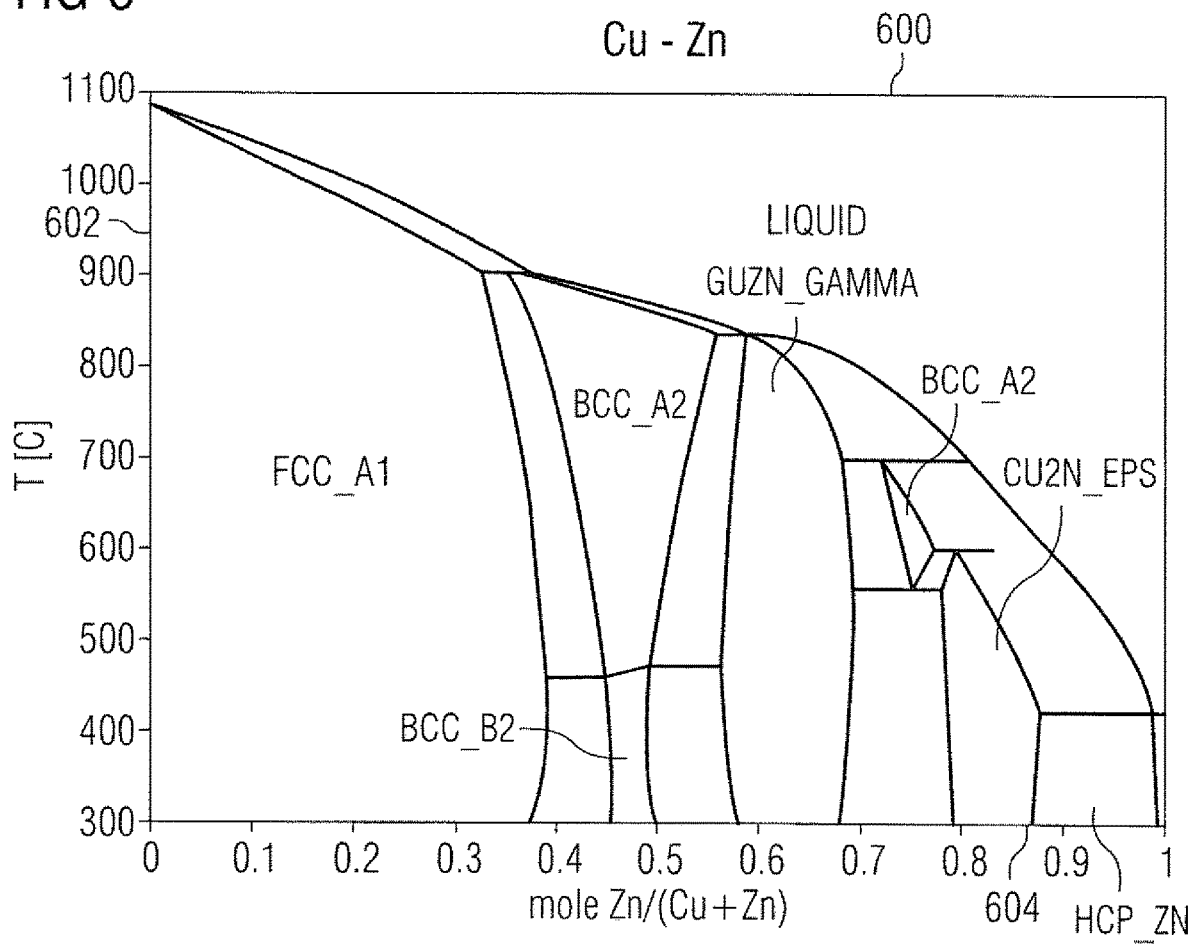
FIG. 6 shows a phase diagram 600 of a Cu—Zn alloy.

FIG. 6 shows a phase diagram 600 of a Cu—Zn binary alloy. With an atomic composition of approximately 2% copper and 98% zinc, the Cu—Zn binary alloy may achieve a melting point of approximately 425° C. Table 606 shows the different phases with related alloy concentrations of the Cu—Zn binary alloy.

Figure 7:
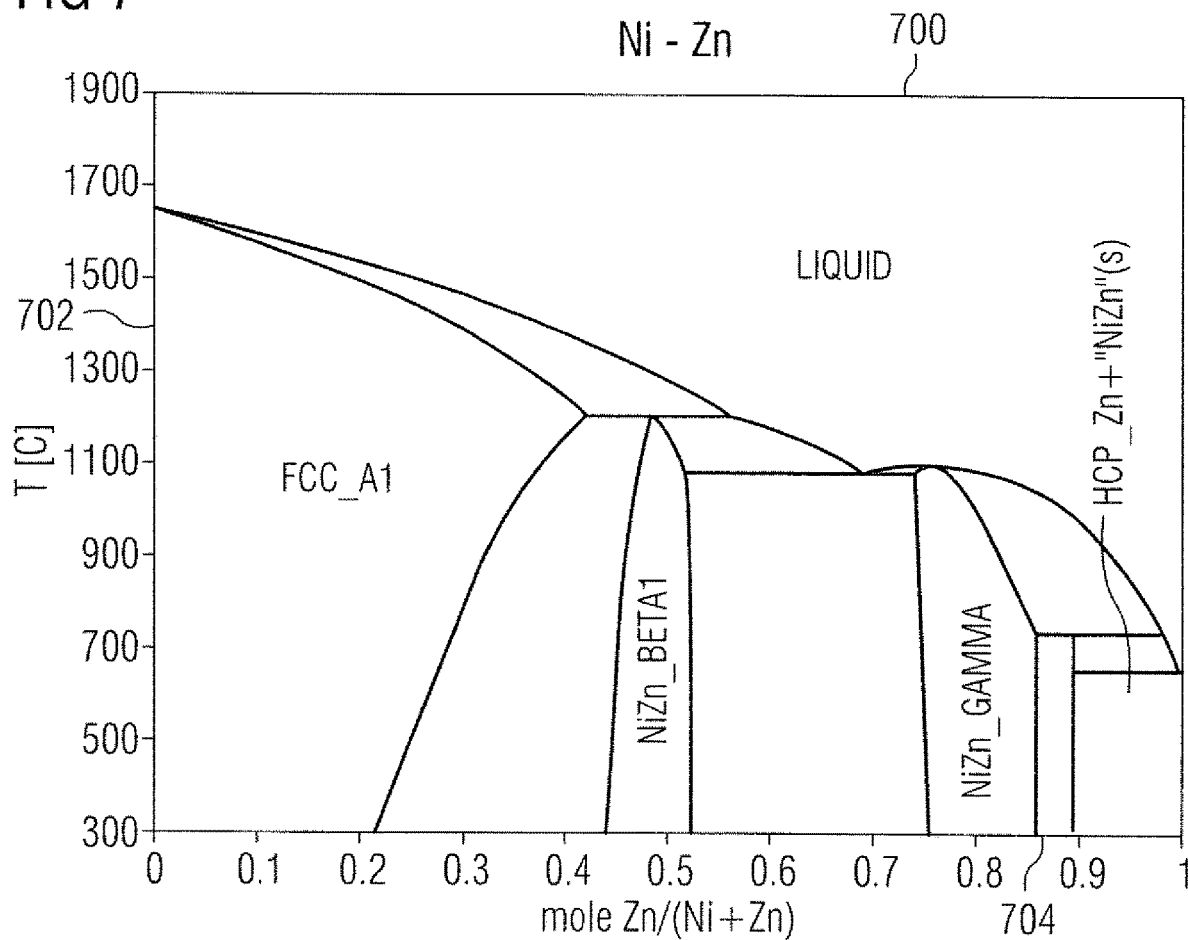
FIG. 7 shows a phase diagram 700 of a Ni—Zn alloy.

FIG. 7 shows a phase diagram 700 of a Ni—Zn binary alloy. With an atomic composition of approximately 1% nickel and 99% zinc, the Ni—Zn binary alloy may achieve a melting point of approximately 700° C. Table 706 shows the different phases with related alloy concentrations of the Ni—Zn binary alloy.

FIG. 8 shows a method for attaching and/or joining a chip 814 to a carrier. The method may include, in 800, selecting carrier, 802 e.g. a substrate or a lead frame; in 804, forming plating 806, e.g. a nickel plating, over carrier 802; in 808, depositing solder alloy 810 over carrier 802, wherein solder alloy 810 may be formed directly on plating 806. In 808, depositing solder alloy 810 may be carried out according to a conventional wire bond process by melting solder alloy 810 which may be in wire and a soft solder, over carrier 802, e.g. by forming a solder dot from solder alloy 810. Solder alloy 810 may be deposited in ribbon form or plated over carrier 802. Alternatively, solder alloy 810 may be placed over or directly on chip 814 at wafer level, i.e. before dicing of the wafer or on chip backside 820 wherein the chip back side may include chip back side metallization 816. In 812, chip 814 may be attached to carrier 802 via solder alloy 810, wherein solder alloy 810 may be a connecting or joining material between chip 814 and carrier 802. In 822, a further solder alloy 828 may be configured to attach a clip-on connection to a contact surface on a chip front side 830 by depositing solder alloy 810 over one or more contact pads 818 on the chip front side 830. One or more contact wires 824 may be attached to chip 814 and/or contact pads 818 via solder alloy 828. The deposition and placement of solder alloys 810, and further solder alloy 828 may be carried out by dispensing a paste of said alloys and/or through a plasma gun.

Solder alloy 810 may be used for joining chip back side 820 to carrier 802, e.g. a lead frame, even if chip 814 is not a silicon-based chip. Chip back side 820 may include a backside metallization 816 system including a multilayer system or part or a variant of a multilayer system. The multilayer system may include individual layers having individual functions.

The multilayer system may include contact layer 816a for contacting to a semiconductor material, e.g. an aluminum contact layer, wherein the aluminum forms a layer having a thickness ranging from 50 nm to 1000 nm.

The multilayer system may include barrier layer 816b, e.g. a titanium (Ti) or titanium-tungsten (TiW) barrier layer, wherein barrier layer 816b may have a thickness ranging from 50 nm to 1000 nm.

The multilayer system may include solder reaction layer 816c, the solder reaction layer 816c including at least one of a group of the following elements and/or alloys thereof: nickel, nickel-vanadium, silver, aluminum, gold, platinum, palladium, nickel, wherein the solder reaction layer 816c may have a thickness ranging from 50 nm to 1000 nm. Solder reaction layer 816c may be a "partner" layer with solder alloy 810 as the thickness of solder reaction layer 816c may be selected so that during the solder process it does not dissolve completely in solder alloy 810.

The multilayer system may include oxidation protection layer 816d to prevent oxidation of the solder reaction layer 816c as solder reaction layers 816c including silver, gold, platinum, palladium or alloys thereof, may be prone to oxidation. Oxidation protection layer 816d may have a thickness ranging from 50 nm to 1000 nm.

Substrate 802 may be formed from one of the following group of materials: copper, nickel, silver or a ceramic. Plating 806 may be formed over substrate 802, e.g. substrate 802 may be a lead frame wherein lead frame plating may be formed over the lead frame. Plating 806 may include at least one from the following group of materials: silver, gold, nickel, platinum, palladium, vanadium, molybdenum, tin, copper, arsenic, antimony, gallium, zinc, aluminum, niobium, tantalum, phosphorus, silver, nickel, nickel phosphorus in elemental form and/or in nitride form and/or in oxide form, the at least one from said group of materials, individually, or in combination. Plating 806 may be configured to be in connection with solder alloy 810.

According to various embodiments, substrate 802 may include plating 806 including copper in combination with nickel and/or nickel phosphorus, wherein plating 806 may be a lead frame plating configured to be in connection with the solder alloy. According to various embodiments, plating 806 thickness may lie in the range from about 100 nm to about 3 µm.

According to various embodiments, chip 814 may include chip back side 820 including at least one from the following group of materials: aluminum, titanium, nickel vanadium, silver, wherein chip back side 820 may be configured to be in connection with solder alloy 810.

Solder alloy 810A according to various embodiments may include zinc, aluminum, magnesium and gallium, wherein aluminum constitutes by weight 8% to 20% of alloy 810A, magnesium constitutes by weight 0.5% to 20% of alloy 810A and gallium constitutes by weight 0.5% to 20% of alloy 810A, the rest of alloy 810A including zinc. Solder alloy 810A may be represented by the chemical formula $ZnAl_{4.5}Ga_1Mg_1$. Solder alloy 810A may be represented by the chemical formula $ZnAl_{12}Ga_1Mg_1$. According to various embodiments, solder alloy 810A may be a solder wire. Aluminum may constitute by weight 3% to 12% of alloy 810A. Magnesium may constitute by weight 0.5% to 4% of alloy 810A. Gallium may constitute by weight 0.5% to 4% of alloy 810A.

Solder alloy 810B according to various embodiments may include zinc, aluminum, tin and magnesium, wherein aluminum constitutes by weight 1% to 30% of alloy 810B, magnesium constitutes by weight 0.5% to 20% of alloy 810B and tin constitutes by weight 0.5% to 6.5% of alloy 810B, the rest of alloy 810B including zinc. Aluminum may constitute by weight 3% to 8% of alloy 810B. Magnesium may constitute by weight 0.5% to 4% of alloy 810B. Tin may constitute by weight 0.5% to 4% of alloy 810B. Solder alloy 810B may be represented by the chemical formula $ZnAl_4Sn_2Mg_1$.

Solder alloy 810C according to various embodiments may include zinc, aluminum, germanium and gallium, wherein aluminum constitutes by weight 1% to 30% of alloy 810C, germanium constitutes by weight 0.5% to 20% of alloy 810C and gallium constitutes by weight 0.5% to 20% of alloy 810C, the rest of alloy 810C including zinc. Aluminum may constitute by weight 3% to 8% of alloy 810C. Germanium may constitute by weight 0.5% to 4% of alloy 810C. Gallium may constitute by weight 0.5% to 4% of alloy 810C.

Solder alloy 810D according to various embodiments may include zinc, aluminum and germanium, wherein aluminum constitutes by weight 1% to 20% of alloy 810D, germanium constitutes by weight 1% to 20% of alloy 810D, the rest of alloy 810D including zinc. Solder alloy 810D may be represented by the chemical formula $ZnAl_5Ge_3$. Solder alloy 810D may be represented by the chemical formula $ZnAl_{12}Ge_3$. Solder alloy 810D may be represented by the chemical formula $ZnAl_6Ge_3$. Solder alloy may be represented by the chemical formula $ZnAl_6Ge_5$. According to various embodiments, aluminum may constitute by weight 3% to 8% of alloy 810D. According to various embodiments, germanium may constitute by weight 1% to 6% of alloy 810D.

Solder alloy 810E according to various embodiments, may include zinc, aluminum and magnesium, wherein aluminum constitutes by weight 1% to 20% of alloy 810E, magnesium constitutes by weight 1% to 20% of alloy 810E, the rest of alloy 810E including zinc. Aluminum may constitute by weight 3% to 8% of alloy 810E. Magnesium may constitute by weight 0.5% to 4% of alloy 810E.

Solder alloy 810F according to various embodiments may include zinc and tin, wherein zinc constitutes by weight 10% to 91% of alloy 810F. Solder alloy 810F may be represented by the chemical formula $Zn_{40}Sn_{60}$. Zinc may constitute by weight 10% to 15% of alloy 810F.

Solder alloy 810G according to various embodiments may include zinc and silver, wherein zinc constitutes by weight 26% to 98% of alloy 810G. Zinc may constitute by weight 83% to 99% of alloy 810G.

Solder alloy 810H according to various embodiments may include zinc and copper, wherein zinc constitutes by weight 80% to 98% of alloy 810H. Zinc may constitute by weight 88% to 99% of alloy 810H.

According to an embodiment, each of solder alloys 810A to 810H may further include at least one from the following group of materials: silver, gold, nickel, platinum, palladium, vanadium, molybdenum, tin, copper, arsenic, antimony, gallium, zinc, aluminum, niobium, tantalum, each and/or in combination including by weight 0.001% to 10% of alloys 810A to 810H.

FIG. 9A shows arrangements 930, 932 and 934 according to various embodiments. Arrangement 930 shows solder alloy 810, e.g. solder alloy 810D deposited on carrier 802, e.g. a lead frame, before attaching chip 814 to carrier 802. Arrangement 932 shows an ultrasonic plot of said arrangement 930 after attaching chip 814 using a chip attachment process to said solder alloy 810, e.g. solder alloy 810D, e.g. solder alloy 810D having a chemical formula $ZnAl_5Ge_3$. Arrangement 934 shows an ultrasonic plot according to arrangement 932 wherein solder alloy 810 has a chemical formula $ZnAl_{12}Ge_3$.

FIG. 9B shows arrangements 936, 938 and 940 according to various embodiments. Arrangement 936 shows an ultrasonic plot of solder alloy 810, e.g. solder alloy 810A on carrier 802, e.g. a lead frame, after attaching chip 814 using a chip attachment process to said solder alloy 810, e.g. solder alloy 810A having a chemical formula $ZnAl_{4.5}Ga_1Mg_1$. Arrangement 938 shows an ultrasonic plot according to arrangement 936, wherein solder alloy 810 has a chemical $ZnAl_{12}Ga_1Mg_1$. White coloured spots in the ultrasonic plots are indicating delamination or voids whereas black areas are directly connected homogenous solder areas.

Figure 10A:
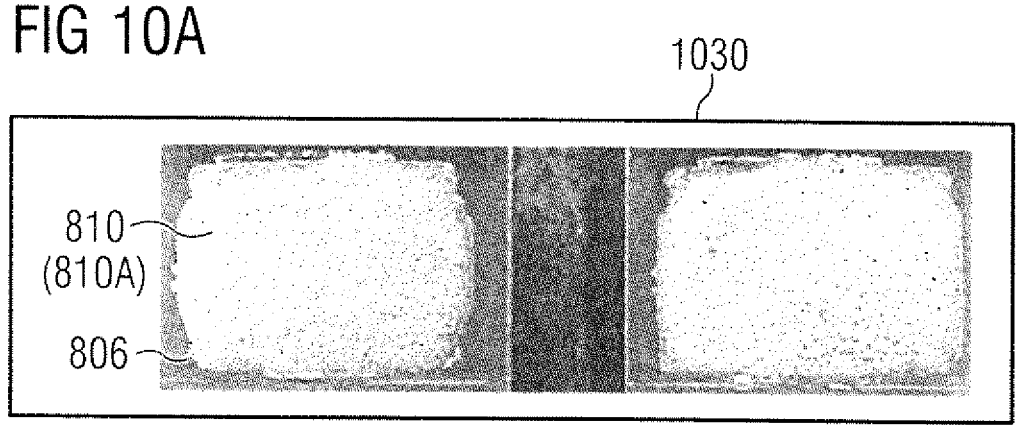
FIGS. 10A to 10C show an arrangement including a solder alloy applied to a carrier according to various embodiments.
Figure 10B:
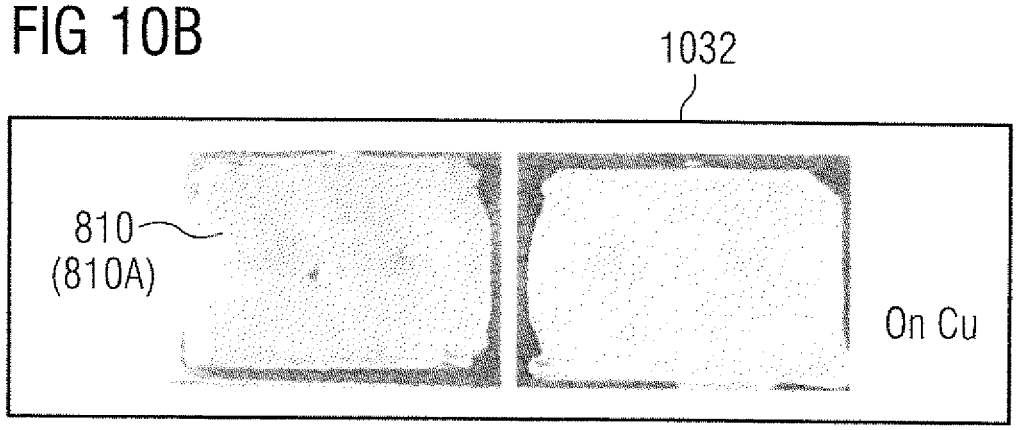
Figure 10C:
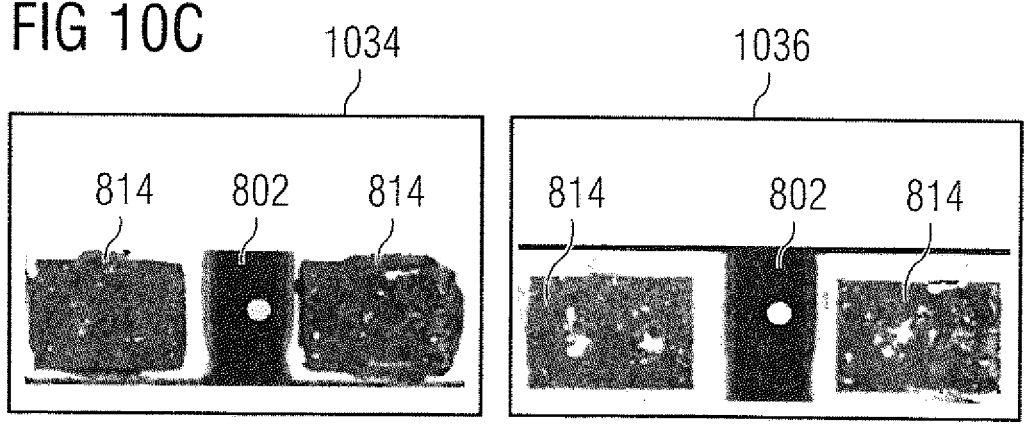

FIG. 10A shows an arrangement 1030 wherein solder alloy 810, e.g. solder alloy 810A, including zinc, aluminum, magnesium and gallium may be applied to a carrier 802, e.g. a lead frame, wherein the lead frame includes lead frame plating 806 including NiNiP. FIG. 10B shows an arrangement 1032 which shows various embodiments according to arrangement 1030 wherein lead frame plating 806 includes copper instead of NiNiP. Solder alloy 810A shows good wetting behavior on both copper surfaces and NiNiP surfaces of carrier 802, providing the best performances in terms of homogeneity of the solder alloy 810A on the surface of lead frame plating 806. FIG. 10C shows arrangements 1034 and 1036 according to various embodiments. Arrangement 1034 shows an image of the interface between carrier 802, e.g. a lead frame, and solder alloy 810A. Arrangement 1036 shows an image of the interface between carrier 802, e.g. a lead frame, solder alloy 810A, and chip 814. In each of 1034 and 1036, two chips 814 are attached to leadframe 802. The white spots insides the chip areas 814 may be attributed to delaminations or voids. The void rate obtained in solder alloy 810A on plating 806, e.g. lead frame plating including NiNiP is less compared to that of a plating 806 including a Cu lead frame plating.

Figure 11A:
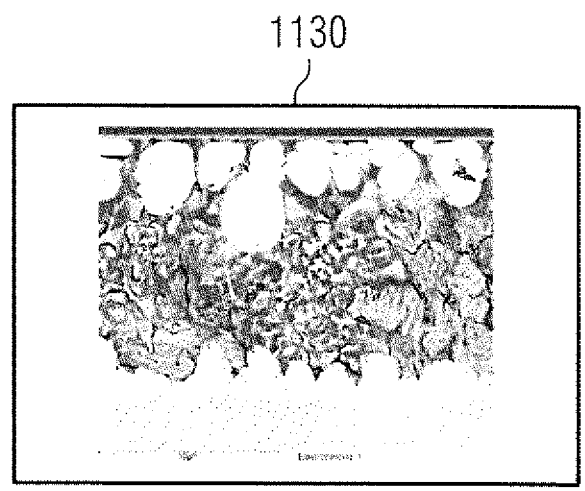
FIGS. 11A and 11B show an images of an arrangement including a solder alloy according to various embodiments.

FIG. 11A shows a scanning electron microscopy (SEM) image 1130 of a cross section of a solder alloy 810A having a chemical formula $ZnAl_{12}Ga_1Mg_1$ deposited on carrier 802 e.g. a copper lead frame, and solder alloy 810A joined to chip back side 820. Chip back side 820 may include chip back side metallization 816 wherein back side metallization 816 may include a Al—Ti—Ag stack. Back side metallization 816 may include contact layer 816a, e.g. aluminum contact layer; barrier layer 816b, e.g. titanium barrier layer; and solder reaction layer 816c, e.g. silver solder reaction layer.

Figure 11B:
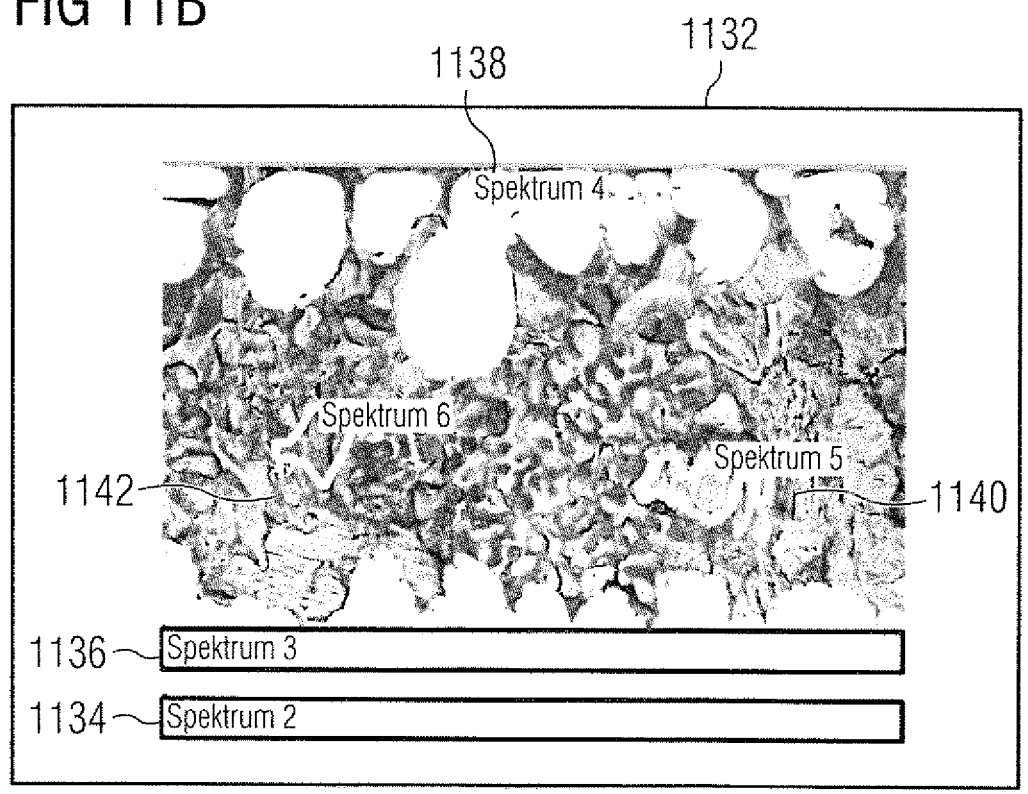

FIG. 11B shows image 1132 wherein marked portions of SEM image 1130 are provided, from which Energy Dispersive X-ray Spectroscopy (EDX) data may be extracted. Spectrum 2 1134 includes zinc, copper and aluminum. Spectrum 3 1136 includes zinc, copper, aluminum and silver. Spectrum 4 1138 includes zinc, copper, silver and trace amounts (less than 2%) of aluminum. Spectrum 5 1140 includes zinc, aluminum, copper and trace amounts (less than 2%) of silver. Spectrum 6 1142 includes zinc, aluminum and trace amounts (less than 2%) of silver. The silver diffuses from solder reaction layer 816c into solder alloy 810A. Gallium may be detected between the grain boundaries, which improves the mechanical properties of the solder, the tensile strength of 345 MPa of solder alloy 810A having a chemical formula $ZnAl_{12}Ga_1Mg_1$ may be attained. Copper diffusion from the leadframe into all bright visible parts of the cross-section is detected.

FIG. 12 shows differential scanning calorimetry plots (DSC) 1230, 1236 of solder alloy 810A. DSC plot 1230 shows Heat flow (W/g) 1232 versus Temperature (° C.) 1234 with respect to solder alloy 810A having chemical formula $ZnAl_{4.5}Ga_1Mg_1$ according to an embodiment. Solder alloy

810A shows exothermic peaks at approximately 262° C., 340° C. and 366° C. The peak representing an enthalpy of 9.0 J/g and peak temperature 261.8° C. reflects an eutectoid reaction between zinc and aluminum. Any further peaks at higher temperatures are created by ternary reactions of Zn—Al with a further alloy element of the alloy, e.g. Ga, Mg. The further peaks reflect the melting temperature range and is of importance for the setting of the process parameters. The occurrence of 2 or more peaks at specific positions are characteristic of a specific composition of the alloy with specific phases formed during the manufacturing process of the wires.

DSC plot 1236 shows Heat flow (W/g) 1238 versus Temperature (° C.) 1240 with respect to solder alloy 810A having chemical formula $ZnAl_{12}Ga_1M_{g1}$ according to an embodiment. Solder alloy 810A shows exothermic peaks at approximately 273° C., 344° C. Thus, a melting point of approximately 344° C. may be attained in solder alloy 810A having chemical formula $ZnAl_{12}Ga_1Mg_1$. The peak representing an enthalpy of 24.4 J/g and peak temperature 272.6° C. reflects an eutectoid reaction between zinc and aluminum. Any further peaks at higher temperatures are created by ternary reactions of Zn—Al with a further alloy element of the alloy, e.g. Ga, Mg.

Figure 13:
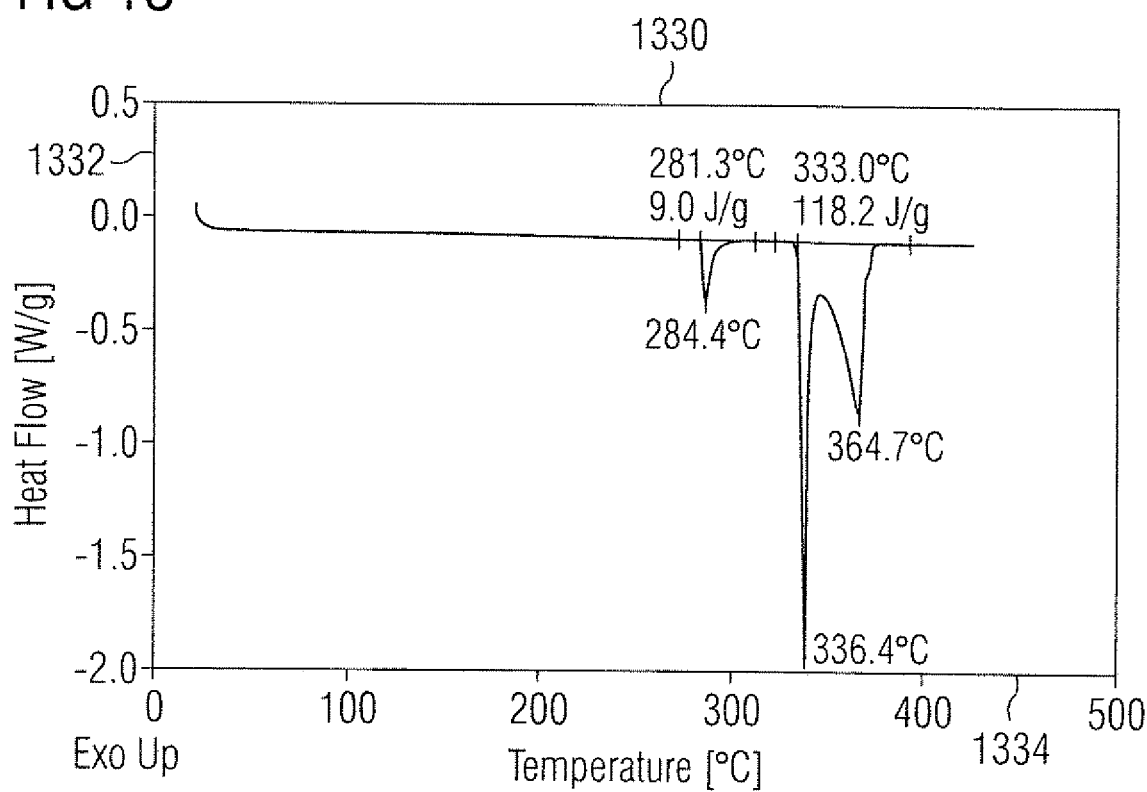

FIG. 13 shows DSC plot 1330 showing Heat flow (W/g) 1332 versus Temperature (° C.) 1334 with respect to solder alloy 810B having chemical formula $ZnAl_4Sn_2Mg_1$ according to various embodiments. Solder alloy 810B shows exothermic peaks at approximately 284° C., 336° C. and 365° C. The peak representing an enthalpy of 9.0 J/g and peak temperature 284.4° C. reflects an eutectoid reaction between zinc and aluminum. Any further peaks at higher temperatures are created by ternary reactions of Zn—Al with a further alloy element of the alloy, e.g. Sn, Mg.

FIG. 14 shows differential scanning calorimetry plots (DSC) 1430, 1436 of solder alloy 810D. DSC plot 1430 shows Heat flow (W/g) 1432 versus Temperature (° C.) 1434 with respect to solder alloy 810D having chemical formula $ZnAl_5Ge_3$ according to various embodiments. Solder alloy 810D shows exothermic peaks at approximately 283° C. and 359° C. The peak representing an enthalpy of 8.6 J/g and peak temperature 282.8° C. reflects an eutectoid reaction between zinc and aluminum. Any further peaks at higher temperatures are created by ternary reactions of Zn—Al with a further alloy element of the alloy, e.g. Ge.

DSC plot 1436 shows Heat flow (W/g) 1438 versus Temperature (° C.) 1440 with respect to solder alloy 810D having chemical formula $ZnAl_{12}Ge_3$ according to various embodiments. Solder alloy 810D shows exothermic peaks at approximately 283° C., 359 C, 368° C. and 412° C. The peak representing an enthalpy of 24.4 J/g and peak temperature 282.8° C. reflects an eutectoid reaction between zinc and aluminum. Any further peaks at higher temperatures are created by ternary reactions of Zn—Al with a further alloy element of the alloy, e.g. Ge.

Figure 15:
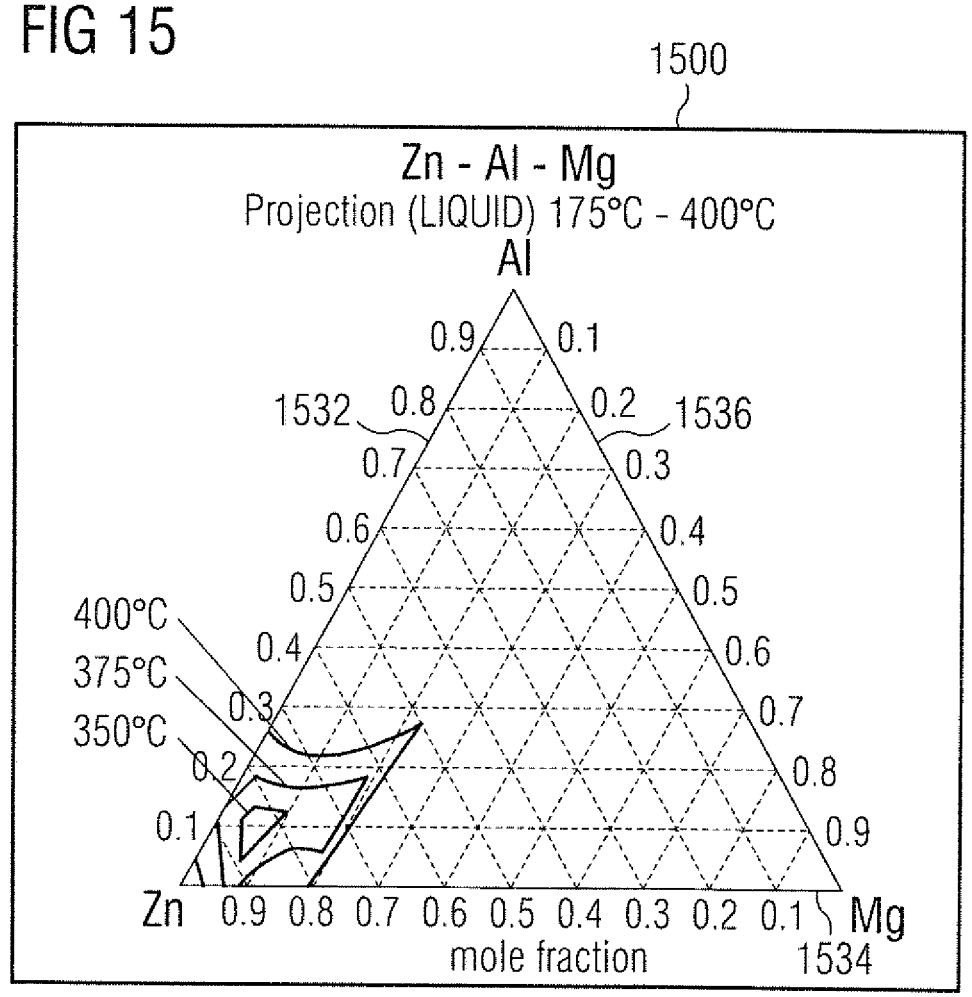
FIG. 15 shows a plot of experimental solder composition versus theoretical liquid phase projection for a solder alloy comprising zinc, aluminum and magnesium.

FIG. 15 shows a plot 1500 of experimental solder composition versus theoretical liquid phase projection for a solder alloy including zinc, aluminum and magnesium. According to various embodiment, a lowest achievable melting temperature for the solder alloy of approximately 350° C. may be attainable at an atomic zinc composition of between approximately 91% to 96%. Axis 1532 indicates the molar fraction of aluminum relative to zinc. Axis 1534 indicates the molar fraction of zinc relative to magnesium. Axis 1536 indicates the molar fraction of magnesium relative to aluminum. The quaternary solder compositions 810B (ZnAl4Sn2Mg1) and 810A (ZnAl5Mg1Ga1) could be placed slightly above the horizontal 400° C. line of the diagram in FIG. 15 since the low concentrations of tin for 810B and gallium for 810A will not change significantly the liquidus temperatures of the solders 810B and 810A.

FIG. 16 shows a plot 1600 of experimental solder composition versus theoretical liquid phase projection for a solder alloy including zinc, aluminum and germanium. Axis 1632 indicates the molar fraction of aluminum relative to zinc. Axis 1634 indicates the molar fraction of zinc relative to germanium. Axis 1636 indicates the molar fraction of germanium relative to aluminum. Plot 1638 shows a magnified portion of selected portion 1640, wherein a lowest achievable melting temperature for the solder alloy of approximately 335° C. may be attainable at an atomic composition of 97 Zn %, 1.5 Al % and 1.5 Ge %. Solder alloy 810 having the chemical formula $ZnAl_{12}Ge_3$ and $ZnAl_5Ge_3$ are points indicated on plot 1600 and 1638. With an atomic composition of 1.6% aluminum, 80% zinc and 3.4% germanium, a four-phase intersection may be obtained. A melting temperature of 343.42° C. may further be obtained.

In various embodiments, a solder alloy is provided. The solder alloy may include zinc, aluminum, magnesium and gallium, wherein the aluminum constitutes by weight 8% to 20% of the alloy, the magnesium constitutes by weight 0.5% to 20% of the alloy and the gallium constitutes by weight 0.5% to 20% of the alloy, the rest of the alloy including zinc. In various embodiments, the solder alloy may be represented by the chemical formula $ZnAl_{4.5}Ga_1Mg_1$. In various embodiments, the solder alloy may be represented by the chemical formula $ZnAl_{12}Ga_1Mg_1$. In various embodiments, the solder alloy may be a solder wire. In various embodiments, the aluminum may constitute by weight 3% to 12% of the alloy. In various embodiments, the magnesium may constitute by weight 0.5% to 4% of the alloy. In various embodiments, the gallium may constitute by weight 0.5% to 4% of the alloy. In various embodiments, the alloy may further include at least one from the following group of materials: silver, gold, nickel, platinum, palladium, vanadium, molybdenum, tin, copper, arsenic, antimony, gallium, zinc, aluminum, niobium, tantalum, each and/or in combination comprising by weight 0.001% to 10% of the alloy.

In various embodiments, a solder alloy is provided. The solder alloy may include zinc, aluminum, tin and magnesium, wherein the aluminum constitutes by weight 1% to 30% of the alloy, the magnesium constitutes by weight 0.5% to 20% of the alloy and the tin constitutes by weight 0.5% to 6.5% of the alloy, the rest of the alloy including zinc. In various embodiments, the aluminum may constitute by weight 3% to 8% of the alloy. In various embodiments, the magnesium may constitute by weight 0.5% to 4% of the alloy. In various embodiments, the tin may constitute by weight 0.5% to 4% of the alloy. In various embodiments, the solder alloy may be represented by the chemical formula $ZnAl_4Sn_2Mg_1$. In various embodiments, the alloy may further include at least one from the following group of materials: silver, gold, nickel, platinum, palladium, vanadium, molybdenum, tin, copper, arsenic, antimony, gallium, zinc, aluminum, niobium, tantalum, each and/or in combination including by weight 0.001% to 10% of the alloy.

In various embodiments, a solder alloy is provided. The solder alloy may include zinc, aluminum, germanium and gallium, wherein the aluminum constitutes by weight 1% to 30% of the alloy, the germanium constitutes by weight 0.5% to 20% of the alloy and the gallium constitutes by weight 0.5% to 20% of the alloy, the rest of the alloy including zinc. In various embodiments, the aluminum may constitute by weight 3% to 8% of the alloy. In various embodiments, the germanium may constitute by weight 0.5% to 4% of the alloy. In various embodiments, the gallium may constitute by weight 0.5% to 4% of the alloy. In various embodiments, the alloy may further include at least one from the following group of materials: silver, gold, nickel, platinum, palladium, vanadium, molybdenum, tin, copper, arsenic, antimony, gallium, zinc, aluminum, niobium, tantalum, each and/or in combination including by weight 0.001% to 10% of the alloy.

In various embodiments, an arrangement is provided. The arrangement may include a chip; a solder alloy configured to attach the chip to a lead frame; the solder alloy including: zinc, aluminum and germanium, wherein the aluminum constitutes by weight 1% to 20% of the alloy, the germanium constitutes by weight 1% to 20% of the alloy, the rest of the alloy including zinc. In various embodiments, the solder alloy may be represented by the chemical formula $ZnAl_5Ge_3$. In various embodiments, the solder alloy may be represented by the chemical formula $ZnAl_{12}Ge_3$. In various embodiments, the solder alloy is represented by the chemical formula $ZnAl_6Ge_3$. In various embodiments, the solder alloy may be represented by the chemical formula $ZnAl_6Ge_5$. In various embodiments, the aluminum may constitute by weight 3% to 8% of the alloy. In various embodiments, the germanium may constitute by weight 1% to 6% of the alloy. In various embodiments, the alloy may further include at least one from the following group of materials: silver, gold, nickel, platinum, palladium, vanadium, molybdenum, tin, copper, arsenic, antimony, gallium, zinc, aluminum, niobium, tantalum, each and/or in combination including by weight 0.001% to 10% of the alloy. In various embodiments, the lead frame may include a lead frame plating including at least one from the following group of materials: silver, gold, nickel, platinum, palladium, vanadium, molybdenum, tin, copper, arsenic, antimony, gallium, zinc, aluminum, niobium, tantalum, phosphorus, silver, nickel, nickel phosphorus in elemental form and/or in nitride form and/or in oxide form, the at least one from said group of materials, individually, or in combination comprising the lead frame plating; wherein the lead frame plating is configured to be in connection with the solder alloy. In various embodiments, the lead frame may include a lead frame plating including copper in combination with nickel and/or nickel phosphorus; wherein the lead frame plating is configured to be in connection with the solder alloy. In various embodiments, the lead frame plating thickness lies between 100 nm to 3 µm. In various embodiments, the chip may include a chip back side including at least one from the following group of materials: aluminum, titanium, nickel vanadium, silver, wherein the chip back side is configured to be in connection with the solder alloy.

In various embodiments, an arrangement is provided. The arrangement may include a chip; a solder alloy for attaching the chip to a lead frame; the solder alloy including zinc, aluminum and magnesium, wherein the aluminum constitutes by weight 1% to 20% of the alloy, the magnesium constitutes by weight 1% to 20% of the alloy, the rest of the alloy including zinc. In various embodiments, the aluminum may constitute by weight 3% to 8% of the alloy. In various embodiments, the magnesium may constitute by weight 0.5% to 4% of the alloy. In various embodiments, the alloy may further include at least one from the following group of materials: silver, gold, nickel, platinum, palladium, vanadium, molybdenum, tin, copper, arsenic, antimony, gallium, zinc, aluminum, niobium, tantalum, each and/or in combination including by weight 0.001% to 10% of the alloy. In various embodiments, the lead frame may include a lead frame plating including at least one from the following group of materials: silver, gold, nickel, platinum, palladium, vanadium, molybdenum, tin, copper, arsenic, antimony, gallium, zinc, aluminum, niobium, tantalum, phosphorus, silver, nickel, nickel phosphorus in elemental form and/or in nitride form and/or in oxide form, the at least one from said group of materials, individually, or in combination including the lead frame plating; wherein the lead frame plating is configured to be in connection with the solder alloy. In various embodiments, the lead frame may include a lead frame plating including copper in combination with nickel and/or nickel phosphorus; wherein the lead frame plating is configured to be in connection with the solder alloy. In various embodiments, the lead frame plating thickness lies between 100 nm to 3 µm. In various embodiments, the chip may include a chip back side including at least one from the following group of materials: aluminum, titanium, nickel vanadium, silver; wherein the chip back side is configured to be in connection with the solder alloy.

In various embodiments, an arrangement is provided. The arrangement may include a chip; a solder alloy configured to attach the chip to a lead frame; the solder alloy including zinc and tin, wherein the zinc constitutes by weight 10% to 91% of the alloy. In various embodiments, the solder alloy may be represented by the chemical formula $Zn_{40}Sn_{60}$. In various embodiments, the zinc may constitute by weight 10% to 15% of the alloy. In various embodiments, the alloy may further include at least one from the following group of materials: silver, gold, nickel, platinum, palladium, vanadium, molybdenum, tin, copper, arsenic, antimony, gallium, zinc, aluminum, niobium, tantalum, each and/or in combination including by weight 0.001% to 10% of the alloy. In various embodiments, the lead frame may include a lead frame plating including at least one from the following group of materials: silver, gold, nickel, platinum, palladium, vanadium, molybdenum, tin, copper, arsenic, antimony, gallium, zinc, aluminum, niobium, tantalum, phosphorus, silver, nickel, nickel phosphorus in elemental form and/or in nitride form and/or in oxide form, the at least one from said group of materials, individually, or in combination including the lead frame plating; wherein the lead frame plating is configured to be in connection with the solder alloy. In various embodiments, the lead frame may include a lead frame plating including copper in combination with nickel and/or nickel phosphorus; wherein the lead frame plating is configured to be in connection with the solder alloy. In various embodiments, the lead frame plating thickness lies between 100 nm to 3 µm. In various embodiments, the chip may include a chip back side including at least one from the following group of materials: aluminum, titanium, nickel vanadium, silver; wherein the chip back side is configured to be in connection with the solder alloy.

In various embodiments, an arrangement is provided. The arrangement may include a chip; a solder alloy configured to attach the chip to a lead frame; the solder alloy including zinc and silver, wherein the zinc constitutes by weight 26% to 98% of the alloy. In various embodiments, the zinc may constitute by weight 83% to 99% of the alloy. In various embodiments, the alloy may further include at least one from the following group of materials: silver, gold, nickel, platinum, palladium, vanadium, molybdenum, tin, copper, arsenic, antimony, gallium, zinc, aluminum, niobium, tantalum, each and/or in combination including by weight 0.001% to 10% of the alloy. In various embodiments, the lead frame may include a lead frame plating including at least one from the following group of materials: silver, gold, nickel, platinum, palladium, vanadium, molybdenum, tin, copper, arsenic, antimony, gallium, zinc, aluminum, niobium, tantalum, phosphorus, silver, nickel, nickel phosphorus in elemental form and/or in nitride form and/or in oxide form, the at least one from said group of materials, individually, or in combination including the lead frame plating; wherein the lead frame plating is configured to be in connection with the solder alloy. In various embodiments, the lead frame may include a lead frame plating comprising copper in combination with nickel and/or nickel phosphorus; wherein the lead frame plating is configured to be in connection with the solder alloy. In various embodiments, the lead frame plating thickness lies between 100 nm to 3 µm. In various embodiments, the chip may include a chip back side including at least one from the following group of materials: aluminum, titanium, nickel vanadium, silver; wherein the chip back side is configured to be in connection with the solder alloy.

In various embodiments, an arrangement is provided. The arrangement may include a chip; a solder alloy configured to attach the chip to a lead frame; the solder alloy including zinc and copper, wherein the zinc constitutes by weight 80% to 98% of the alloy. In various embodiments, the zinc may constitute by weight 88% to 99% of the alloy. In various embodiments, the alloy may further include at least one from the following group of materials: silver, gold, nickel, platinum, palladium, vanadium, molybdenum, tin, copper, arsenic, antimony, gallium, zinc, aluminum, niobium, tantalum, each and/or in combination including by weight 0.001% to 10% of the alloy. In various embodiments, the lead frame may include a lead frame plating including at least one from the following group of materials: silver, gold, nickel, platinum, palladium, vanadium, molybdenum, tin, copper, arsenic, antimony, gallium, zinc, aluminum, niobium, tantalum, phosphorus, silver, nickel, nickel phosphorus in elemental form and/or in nitride form and/or in oxide form, the at least one from said group of materials, individually, or in combination including the lead frame plating; wherein the lead frame plating is configured to be in connection with the solder alloy. In various embodiments, the lead frame may include a lead frame plating including copper in combination with nickel and/or nickel phosphorus; wherein the lead frame plating is configured to be in connection with the solder alloy. In various embodiments, the lead frame plating thickness lies between 100 nm to 3 µm. In various embodiments, the chip may include a chip back side including at least one from the following group of materials: aluminum, titanium, nickel vanadium, silver; wherein the chip back side is configured to be in connection with the solder alloy.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip arrangement comprising:
   a chip comprising a chip back side;
   a back side metallization on the chip back side, the back side metallization comprising a plurality of layers, wherein a first layer of the plurality of layers is a contact layer which contacts a semiconductor material of the chip back side;
   a copper substrate comprising a surface with a metal layer, the metal layer comprising at least one of nickel or nickel-phosphorous;
   a zinc-based solder alloy which attaches the back side metallization to the metal layer, the zinc-based solder alloy having by weight 8% to 20% aluminum, 0.5% to 20% magnesium, 0.5% to 20% gallium, and the balance zinc;
   wherein the at least one of nickel or nickel-phosphorous in the metal layer provides a reduced void rate at an interface with the zinc-based solder alloy as compared to a void rate of the zinc-based solder alloy on the copper substrate without the metal layer, thereby providing good wettability of the zinc-based solder alloy to the substrate.

2. The chip arrangement of claim 1, wherein the zinc-based solder alloy is represented by the chemical formula $ZnAl_{12}GaMg$.

3. The chip arrangement of claim 1, wherein the zinc-based solder alloy is represented by the chemical formula $ZnAl_{4.5}GaMg$.

4. The chip arrangement of claim 1, wherein the metal layer comprises at least one of: silver, gold, nickel, platinum, palladium, vanadium, molybdenum, tin, copper, arsenic, antimony, gallium, zinc, aluminum, niobium, tantalum, phosphorus, silver, nickel, or nickel phosphorus in at least one of an elemental form, a nitride form, or an oxide form.

5. The chip arrangement of claim 1, wherein the metal layer comprises a thickness in the range from about 100 nm to about 3 µm.

6. The chip arrangement of claim 1, wherein the chip back side metallization comprises at least one of aluminum, titanium, nickel-vanadium, or silver.

7. The chip arrangement of claim 1, wherein the contact layer has a thickness ranging from 50 nm to 1000 nm.

8. The chip arrangement of claim 7, wherein a second layer of the plurality of layers is a barrier layer comprising titanium or titanium-tungsten.

9. The chip arrangement of claim 8, wherein the barrier layer has a thickness ranging from 50 nm to 1000 nm.

10. The chip arrangement of claim 8, wherein a third layer of the plurality of layers is a solder reaction layer comprising at least one of nickel, nickel-vanadium, silver, aluminum, gold, platinum, or palladium.

11. The chip arrangement of claim 10, wherein the solder reaction layer has a thickness ranging from 50 nm to 1000 nm.

12. The chip arrangement of claim 10, wherein a fourth layer of the plurality of layers is an oxidation protection layer which prevents oxidation of the solder reaction layer.

13. The chip arrangement of claim 12, wherein the oxidation protection layer comprises a thickness ranging from 50 nm to 1000 nm.

14. A chip arrangement comprising, a chip comprising a chip back side;
   a back side metallization on the chip back side, the back side metallization comprising a plurality of layers;
   a copper substrate comprising a surface with a metal layer, wherein the metal layer comprises at least one of nickel or nickel-phosphorous;
   a zinc-based solder alloy which attaches the back side metallization to the metal layer, the zinc-based solder alloy having by weight 1% to 30% aluminum, 0.5% to 20% magnesium, 0.5% to 6.5% tin, and the balance zinc,
   wherein the at least one of nickel or nickel-phosphorous in the metal layer provides a reduced void rate at an interface with the zinc-based solder alloy as compared to a void rate of the zinc-based solder alloy directly on the copper substrate without the metal layer, thereby providing good wettability of the zinc-based solder alloy to on the substrate.

15. The chip arrangement of claim 14, wherein the zinc-based solder alloy is represented by the chemical formula $ZnAl_4Sn_2Mg$.

16. The chip arrangement of claim 14, wherein the plurality of layers comprises a contact layer which contacts a semiconductor material of the chip back side; a barrier layer comprising titanium or titanium-tungsten; a solder reaction layer comprising at least one of nickel, nickel-vanadium, silver, aluminum, gold, platinum, or palladium; and an oxidation protection layer which prevents oxidation of the solder reaction layer.

* * * * *